US012784955B2

(12) United States Patent
Park et al.

(10) Patent No.: US 12,784,955 B2

(45) Date of Patent: Nov. 3, 2026

(54) INDUCTOR AND SEMICONDUCTOR PACKAGE INCLUDING THE SAME

(71) Applicant: Samsung Electronics Co., Ltd., Suwon-si (KR)

(72) Inventors: Yukyung Park, Hwaseong-si (KR); Hyunjung Song, Hwaseong-si (KR); Eunkyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 827 days.

(21) Appl. No.: 17/856,122

(22) Filed: Jul. 1, 2022

(65) Prior Publication Data

US 2023/0066895 A1 Mar. 2, 2023

(30) Foreign Application Priority Data

Aug. 24, 2021 (KR) ........................ 10-2021-0111867

(51) Int. Cl.

| | |
|---|---|
| ***H01F 17/00*** | (2006.01) |
| ***H10W 20/40*** | (2026.01) |
| ***H10W 20/41*** | (2026.01) |
| ***H10W 20/42*** | (2026.01) |
| ***H10W 70/685*** | (2026.01) |
| ***H10W 74/01*** | (2026.01) |
| ***H10W 90/00*** | (2026.01) |

(52) U.S. Cl.

CPC ........ *H01F 17/0013* (2013.01); *H10W 20/42* (2026.01); *H10W 20/435* (2026.01); *H10W 20/497* (2026.01); *H10W 70/685* (2026.01); *H10W 74/016* (2026.01); *H10W 90/701* (2026.01); *H01F 2017/0073* (2013.01); *H01F 2017/0086* (2013.01)

(58) Field of Classification Search

None

See application file for complete search history.

(56) References Cited

U.S. PATENT DOCUMENTS 5,416,356 A 5/1995 Staudinger et al.
7,750,408 B2 7/2010 He et al.
(Continued)

FOREIGN PATENT DOCUMENTS

JP 2009016732 A 1/2009
KR 1020110114238 A 10/2011

OTHER PUBLICATIONS

S. Holik and T. Drysdalee, "Simplified Model of a Layer of Interconnects under a Spiral Inductor," Journal of Electromagnetic Analysis and Applications, (2011) pp. 187-190.

*Primary Examiner* — Brent A. Fairbanks
*Assistant Examiner* — Derek L Nielsen
(74) *Attorney, Agent, or Firm* — Muir Patent Law, PLLC

(57) ABSTRACT

An inductor includes a semiconductor substrate provided with a plurality of wiring levels including a first wiring level and a second wiring level, a straight conductive line, at the first wiring level of the semiconductor substrate, having a first end, a conductive coil of a spiral pattern, at the second wiring level over the first wiring level, having a second end, and a conductive via vertically connecting the first end of the straight conductive line to the second end of the conductive coil. When viewed in a plan view, a plurality of dummy patterns are arranged in a first area defined by an innermost turn of the spiral pattern.

11 Claims, 25 Drawing Sheets

10

(56) References Cited

U.S. PATENT DOCUMENTS

| | | | | |
|---|---|---|---|---|
| 2006/0131724 | A1* | 6/2006 | Sato | H10W 42/20 257/E23.114 |
| 2006/0138587 | A1 | 6/2006 | Choi | |
| 2013/0147023 | A1* | 6/2013 | Lin | H10W 20/423 257/659 |
| 2017/0148559 | A1 | 5/2017 | Choi | |
| 2019/0385997 | A1* | 12/2019 | Choi | H01F 17/0006 |
| 2021/0126085 | A1 | 4/2021 | Lee | |

* cited by examiner

1000

INDUCTOR AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2021-0111867, filed on Aug. 24, 2021, in the Korean Intellectual Property Office, the disclosure of which is incorporated by reference herein in its entirety.

BACKGROUND

The inventive concept relates to an inductor and a semiconductor package including the same, and more particularly, to an inductor having a spiral lead and a semiconductor package including the same.

Recently, as semiconductor package manufacturing technology and wireless communication technology improve, technology of configuring a communication circuit in a semiconductor package is applied. For example, system in package (SiP) technology of composing semiconductor chips having different characteristics into one package is being developed. When such a package is implemented, an inductor is treated as a very important component. In particular, in order to configure a communication circuit, a spiral inductor capable of exhibiting high quality is desirable.

SUMMARY

The inventive concept relates to a firm spiral inductor implemented using simple manufacturing processes and having high reliability.

The inventive concept relates to a semiconductor package including a firm spiral inductor implemented using simple manufacturing processes and having high reliability.

A problem to be solved by the inventive concept is not limited to the above-described one and other objects will be clearly understood those skilled in the art from the following description.

According to an embodiment of the present invention, an inductor includes a semiconductor substrate provided with a plurality of wiring levels including a first wiring level and a second wiring level, a straight conductive line, at the first wiring level of the semiconductor substrate, having a first end, a conductive coil of a spiral pattern, at the second wiring level over the first wiring level, having a second end, and a conductive via vertically connecting the first end of the straight conductive line to the second end of the conductive coil. When viewed in a plan view, a plurality of dummy patterns are arranged in a first area defined by an innermost turn of the spiral pattern.

According to an embodiment of the present invention, a semiconductor package includes a package substrate, an interposer arranged on the package substrate, a first semiconductor chip and a second semiconductor chip arranged on the interposer, a first inductor formed in the first semiconductor chip, and a second inductor formed in the interposer. Each of the first and second inductors includes a straight conductive line at a first wiring level, having a first end, a conductive coil of a square spiral pattern at a second wiring level vertically spaced apart from the first wiring level, having a second end, and a conductive via vertically connecting the first end of the straight conductive line to the second end of the conductive coil. When viewed in a plan view, a plurality of island-shaped dummy patterns are arranged in a first area defined by an innermost turn of the square spiral pattern.

According to an embodiment of the present invention, a semiconductor package includes a package substrate, an interposer arranged on the package substrate, a first semiconductor chip and a second semiconductor chip arranged on the interposer, an inductor formed in the first semiconductor chip, a molding member surrounding the first and second semiconductor chips, a heat dissipation member arranged on the molding member, and an encapsulation surrounding the interposer, the molding member, and the heat dissipation member. The inductor includes a straight conductive line at a first wiring level, having a first end, a conductive coil of a square spiral pattern at a second wiring level vertically spaced apart from the first wiring level, having a second end, and a conductive via vertically connecting the first end of the straight conductive line to the second end of the conductive coil. When viewed in a plan view, a plurality of dummy patterns having different shapes are arranged in a first area defined by an innermost turn of the square pattern.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, an embodiment of the inventive concept will be described in detail with reference to the accompanying drawings.

Figure 1A:
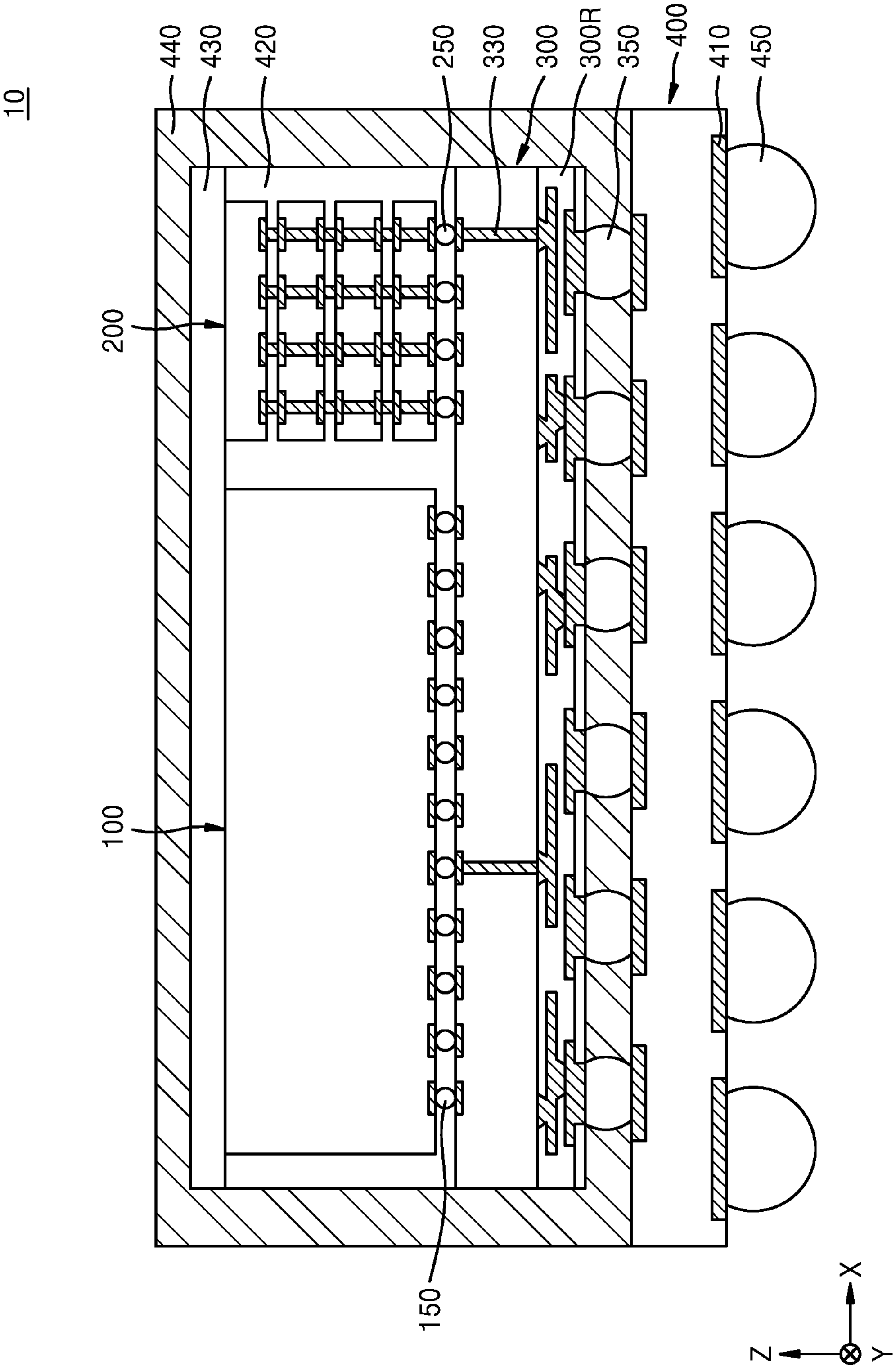
FIG. 1A is a cross-sectional view illustrating a semiconductor package according to an embodiment of the inventive concept.
Figure 1B:
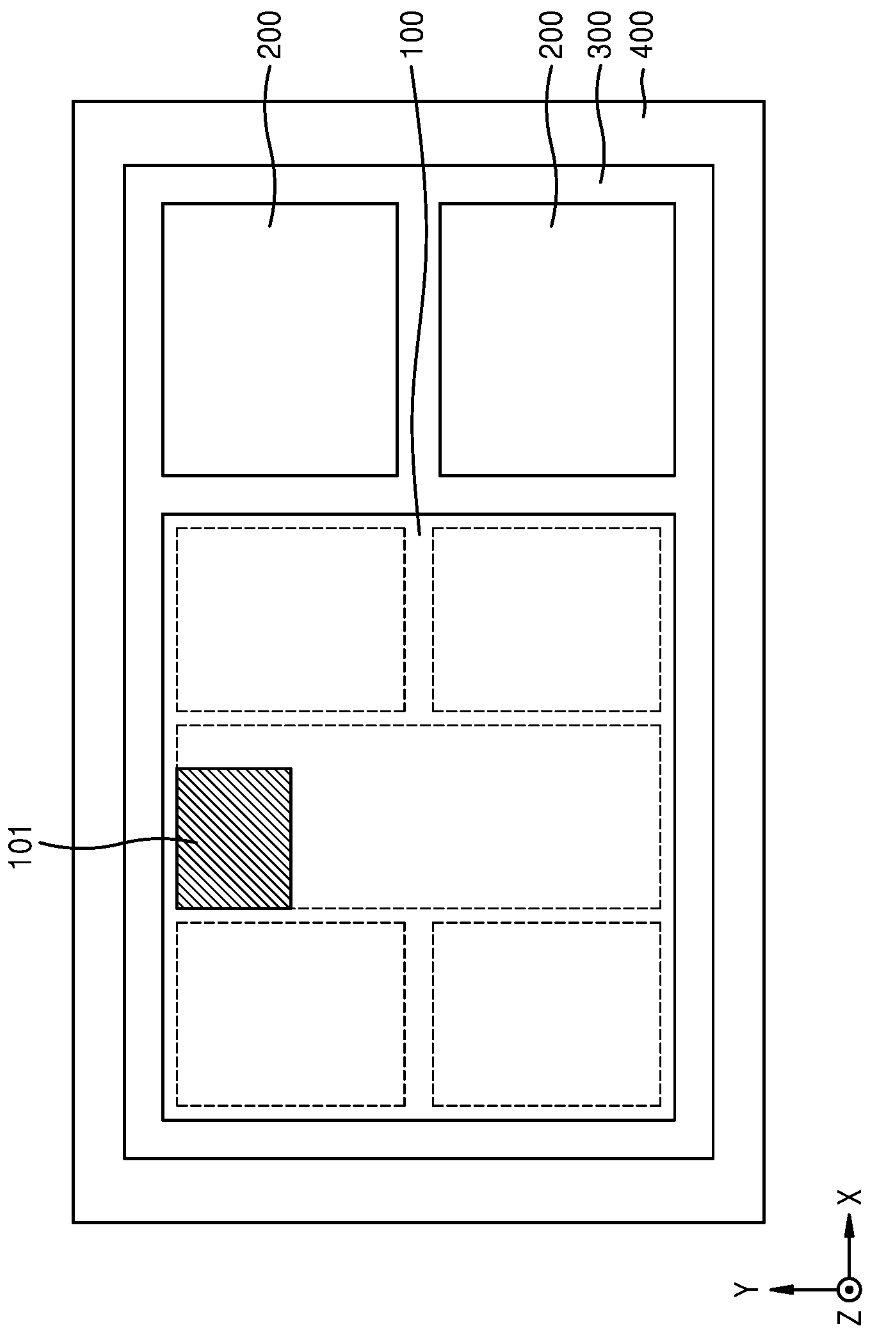
FIG. 1B is a plan view illustrating the semiconductor package of FIG. 1A.
Figure 1C:
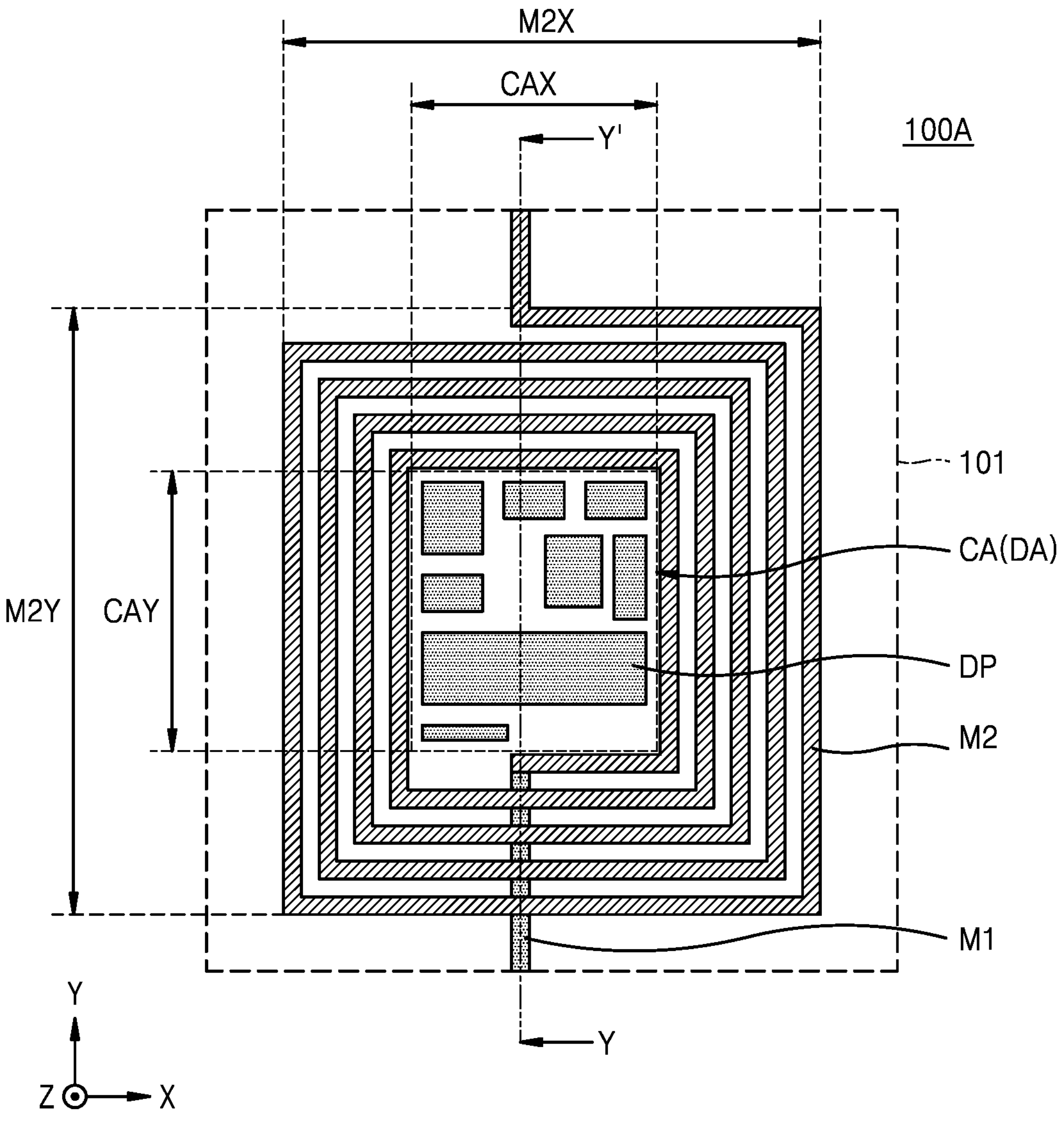
FIG. 1C is a plan view illustrating an enlargement of an inductor according to an embodiment of the inventive concept in FIG. 1B.
Figure 1D:
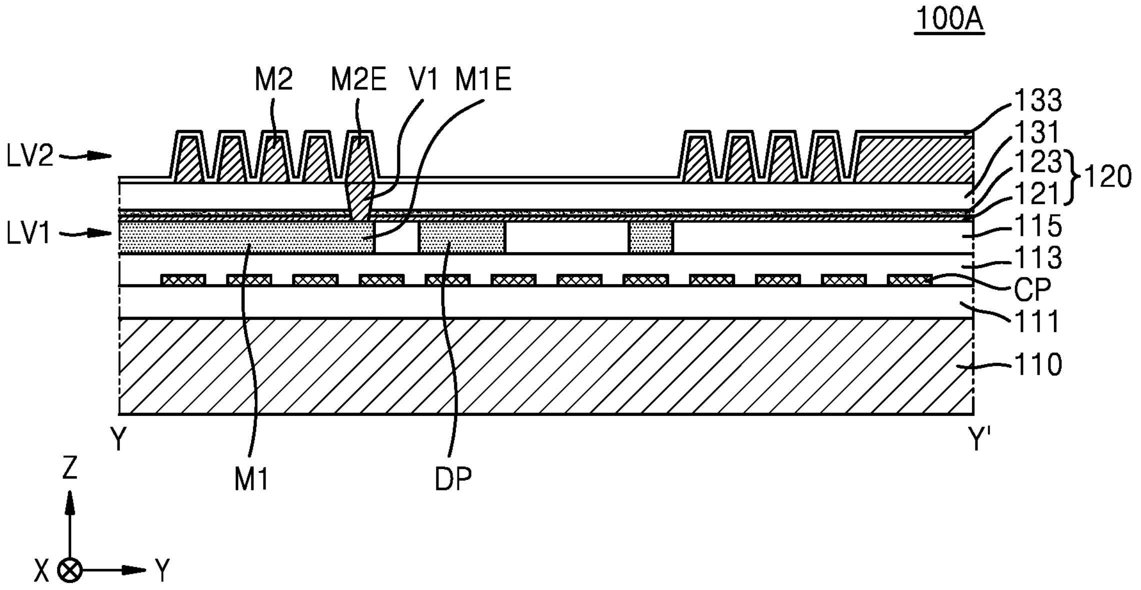
FIG. 1D is a cross-sectional view illustrating an inductor taken along the line Y-Y' of FIG. 1C.

FIG. 1A is a cross-sectional view illustrating a semiconductor package 10 according to an embodiment of the inventive concept. FIG. 1B is a plan view illustrating the semiconductor package 10 of FIG. 1A. FIG. 1C is a plan view illustrating an enlargement of an inductor according to an embodiment of the inventive concept in FIG. 1B. FIG. 1D is a cross-sectional view illustrating an inductor taken along the line Y-Y' of FIG. 1C.

In the current specification, a direction parallel with an X axis and a direction parallel with a Y axis may be respectively referred to as a first horizontal direction and a second horizontal direction and a direction parallel with a Z axis may be referred to as a vertical direction.

A surface defined by a line extending in the X axis and a line extending in the Y axis may be referred to as a plane, a component arranged in a +Z direction relative to another component may be referred to as being above the component, and a component arranged in a −Z direction relative to another component may be referred to as being below the component.

An area of a component may refer to a size occupied by the component in a surface parallel with the plane. It will be understood that when an element is referred to as being “connected” or “coupled” to or “on” another element, it can be directly connected or coupled to or on the other element or intervening elements may be present. In contrast, when an element is referred to as being “directly connected” or “directly coupled” to another element, or as “contacting” or “in contact with” another element, there are no intervening elements present at the point of contact.

In the drawings of the current specification, for convenience sake, only partial layers may be illustrated. A pattern including a conductive material such as a pattern of a metal layer may be referred to as a conductive pattern or may be simply referred to as a pattern.

Referring to FIGS. 1A to 1D, the semiconductor package 10 including a first semiconductor chip 100, a second semiconductor chip 200, an interposer 300, and a package substrate 400 is illustrated.

The first semiconductor chip 100 may include a logic chip. The logic chip may include a plurality of logic elements (i.e., logic cells) (not shown). The logic element may include, for example, a logic circuit such as an AND logic, an OR logic, a NOT logic, and a flip-flop and may perform various signal processing. In some embodiments, the logic element may perform signal processing such as analog signal processing and analog-to-digital (A/D) conversion control. As used herein, the term “logic cells” may refer to a unit circuit configured to perform a single logical operation and be composed of a plurality of interconnected MOSFETs. Examples of logic cells include a NAND gate, a NOR gate, an inverter, and a latch. In addition, it will be apparent that the invention is not limited to one or a plurality of logic cells, but may be implemented in connection with one or more transistors, a portion of a transistor, an integrated circuit (e.g., comprising a plurality of interconnected logic cell), a semiconductor chip, a plurality of semiconductor chips (e.g., stacked in a package), etc.

The logic chip may be implemented by a microprocessor, a graphics processor, a signal processor, a network processor, a chipset, an audio codec, a video codec, an application processor, or a system on chip (SoC) in accordance with a function thereof. The first semiconductor chip 100 may include a communication circuit 101 in which a communication device is arranged and an inductor 100A may be arranged in the communication circuit 101, as described in detail later.

The second semiconductor chip 200 may include a volatile memory chip and/or a non-volatile memory chip. The volatile memory chip may be, for example, dynamic random access memory (DRAM), static RAM (SRAM), or thyristor RAM (TRAM). The non-volatile memory chip may be, for example, flash memory, magnetic RAM (MRAM), spin-transfer torque MRAM (STT-MRAM), ferroelectric RAM (FRAM), phase change RAM (PRAM), or resistive RAM (RRAM). In some embodiments, the second semiconductor chip 200 may include a memory chip set including a plurality of memory chips of which data items may be merged with one another. The second semiconductor chip 200 may include high bandwidth memory (HBM).

The interposer 300 may be arranged under the first and second semiconductor chips 100 and 200 and may electrically connect the first and second semiconductor chips 100 and 200 with each other through first and second bump structures 150 and 250. In some embodiments, the interposer 300 may be a silicon (Si) substrate and may include a redistribution structure 300R arranged under the Si substrate. The interposer 300 may include an internal connection terminal 350 arranged under the redistribution structure 300R and a through electrode 330 electrically connected to the redistribution structure 300R and passing through the Si substrate.

The package substrate 400 may be arranged under the interposer 300 and may be formed based on a printed circuit board (PCB), a wafer substrate, a ceramic substrate, or a glass substrate. In the semiconductor package 10 according to the inventive concept, the package substrate 400 may be a PCB. The package substrate 400 may include a bump pad 410 arranged in a bottom surface thereof and an external connection terminal 450 connected to a bottom of the bump pad 410. The semiconductor package 10 may be electrically connected to and mounted on a module substrate or a system board of an electronic product through the external connection terminal 450.

The first and second semiconductor chips 100 and 200 may be mounted on the interposer 300 side by side in the first horizontal direction (the X direction). The semiconductor package 10 according to the inventive concept may include a molding member 420 surrounding the first and second semiconductor chips 100 and 200 and a heat dissipation member 430 contacting the first and second semiconductor chips 100 and 200 on the molding member 420. The semiconductor package 10 according to the inventive concept may include an encapsulation 440 surrounding the interposer 300, the molding member 420, and the heat dissipation member 430 on the package substrate 400.

As described above, in the semiconductor package 10 according to the inventive concept, the inductor 100A may be arranged in the communication circuit 101 of the first semiconductor chip 100. For example, the communication circuit 101 may include a PCI Express interface. However, the inventive concept is not limited thereto. Here, in a portion in which the inductor 100A is arranged, components of the first semiconductor chip 100 are described in detail as follows.

A semiconductor substrate 110 as a wafer may include an active surface and an inactive surface facing each other. The semiconductor substrate 110 may be, for example, a Si wafer including crystalline silicon, polycrystalline silicon, or amorphous silicon. Alternatively, the semiconductor substrate 110 may include or may be formed of a semiconductor element such as germanium (Ge) or a compound semiconductor such as silicon carbide (SiC), gallium arsenide (GaAs), indium arsenide (InAs), and indium phosphide (InP).

On the other hand, the semiconductor substrate 110 may have a silicon on insulator (SOI) structure. For example, the semiconductor substrate 110 may include a buried oxide (BOX) layer. In some embodiments, the semiconductor substrate 110 may include a conductive area, for example, a well doped with impurities or a structure doped with impurities. The semiconductor substrate 110 may have one of various isolation structures such as a shallow trench isolation (STI) structure.

An inter-metal dielectric (IMD) layer 111 may be arranged on the active surface of the semiconductor substrate 110. The IMD layer 111 may include or may be formed of, for example, silicon oxide, silicon nitride, silicon oxynitride, a low dielectric constant material, an ultralow dielectric constant material, or a combination of the above materials. However, the inventive concept is not limited thereto.

A plurality of dummy capacitor patterns CP may be arranged on the IMD layer 111. In some embodiments, the logic chip may include a metal-insulator-metal (MIM) capacitor (not shown) using a metal as electrode layers. The MIM capacitor has a structure in which a dielectric layer is arranged between upper and lower metal electrode layers. In partial areas other than an area in which the MIM capacitor is arranged, the plurality of dummy capacitor patterns CP may be arranged.

A lower insulating layer 113 may be arranged on the IMD layer 111 so as to cover the plurality of dummy capacitor patterns CP. The lower insulating layer 113 may be, for example, phosphor silicate glass (PSG), boro-phosphor silicate glass (BPSG), undoped silicate glass (USG), tetra ethyl ortho silicate (TEOS), plasma enhanced-TEOS (PE-TEOS), high density plasma-chemical vapor deposition (HDP-CVD) oxide, or oxide such as a low dielectric constant material and an ultralow dielectric constant material used for back-end of line (BEOL).

A conductive line M1 and a plurality of dummy patterns DP may be arranged on the lower insulating layer 113. A level at which the conductive line M1 and the plurality of dummy patterns DP are arranged may be referred to as a first wiring level LV1. A thickness of the conductive line M1 may be equal to a thickness of the plurality of dummy patterns DP. The conductive line M1 and the plurality of dummy patterns DP may include or may be formed of the same material as each other. The conductive line M1 and the plurality of dummy patterns DP may include or may be formed of, for example, titanium (Ti), Ti nitride (TiN), tantalum (Ta), TaN, tungsten (W), copper (Cu), aluminum (Al), a mixture of the above materials, or a compound of the above materials. However, the inventive concept is not limited thereto. In the inductor 100A according to the inventive concept, the conductive line M1 and the plurality of dummy patterns DP may include or may be formed of Cu.

An inter-layer dielectric (ILD) 115 may be arranged on the lower insulating layer 113 to surround the conductive line M1 and the plurality of dummy patterns DP. A top surface of the ILD 115 may be on the same plane as a top surface of the conductive line M1 and top surfaces of the plurality of dummy patterns DP. The ILD 115 may be, for example, PSG, BPSG, USG, TEOS, PE-TEOS, HDP-CVD oxide, or oxide such as a low dielectric constant material and an ultralow dielectric constant material used for BEOL. However, the inventive concept is not limited thereto.

A multilayered insulating layer 120 may be arranged to cover the top surface of the conductive line M1, the top surfaces of the plurality of dummy patterns DP, and a top surface of the ILD 115. The multilayered insulating layer 120 may include a lower first insulating layer 121 and an upper second insulating layer 123. The lower first insulating layer 121 may include or may be formed of SiCN and the upper second insulating layer 123 may include or may be formed of SiN. In some embodiments, an insulating material of the lower first insulating layer 121 may be different from an insulating material of the lower insulating layer 113.

An upper insulating layer 131 may be arranged to cover the multilayered insulating layer 120. The upper insulating layer 131 may be, for example, PSG, BPSG, USG, TEOS, PE-TEOS, HDP-CVD oxide, or oxide such as a low dielectric constant material and an ultralow dielectric constant material used for BEOL. However, the inventive concept is not limited thereto.

A conductive via V1 may be arranged to pass through the upper insulating layer 131 and the multilayered insulating layer 120 and to contact a first end M1E of the conductive line M1. In FIG. 1D, the conductive via V1 is illustrated as being singular. However, the conductive via V1 may be provided in plural. Due to a characteristic of a patterning process of dry etching an opening in which the conductive via V1 is to be arranged first, the conductive via V1 may not have a vertical side wall and may be tapered inverted trapezoid-shaped so that a width thereof is reduced downward in the vertical direction (the Z direction).

The conductive via V1 may include or may be formed of a conductive material, for example, Ti, TiN, Ta, TaN, W, Cu, Al, a mixture of the above materials, or a compound of the above materials. However, the inventive concept is not limited thereto. In some embodiments, the conductive via V1 and the conductive line M1 may include or may be formed of different materials from each other. In the inductor 100A according to the inventive concept, the conductive via V1 may include or may be formed of Al.

A conductive coil M2 may be arranged on the upper insulating layer 131. A level at which the conductive coil M2 is arranged may be referred to as a second wiring level LV2. A second end M2E of the conductive coil M2 may be arranged to contact the conductive via V1. Due to a characteristic of a patterning process of forming a metal wiring line first and dry etching the metal wiring line, the conductive coil M2 may not have a vertical side wall and may be tapered trapezoid-shaped so that a width thereof increases downward in the vertical direction (the Z direction).

The conductive coil M2 may include or may be formed of a conductive material, for example, Ti, TiN, Ta, TaN, W, Cu, Al, a mixture of the above materials, or a compound of the above materials. However, the inventive concept is not limited thereto. In some embodiments, the conductive coil M2 and the conductive via V1 may include or may be formed of the same material as each other. In the inductor 100A according to the inventive concept, the conductive coil M2 may include or may be formed of Al.

A cover insulating layer 133 may be arranged on the upper insulating layer 131 to cover the conductive coil M2. The cover insulating layer 133 may be conformally arranged along a curved top surface of the conductive coil M2. The cover insulating layer 133 may be, for example, PSG, BPSG, USG, TEOS, PE-TEOS, HDP-CVD oxide, or oxide such as a low dielectric constant material and an ultralow dielectric constant material used for BEOL. However, the inventive concept is not limited thereto.

As described above, the inductor 100A according to the inventive concept may be at two wiring levels LV1 and LV2. For example, on the semiconductor substrate 110 including a plurality of wiring levels, the conductive line M1 arranged at the first wiring level LV1, the conductive coil M2 arranged at the second wiring level LV2 over the first wiring level LV1, and the conductive via V1 connecting the conductive line M1 to the conductive coil M2 in the vertical direction (the Z direction) may be provided.

The conductive line M1 may be straight line shaped, and the conductive via V1 may contact the straight line shaped first end M1E. The conductive coil M2 may have a square spiral pattern and may include a spiral lead which is an innermost starting portion of the square spiral pattern. In some embodiments, the conductive via V1 may contact the second end M2E of the spiral lead. The present invention, however, is not limited thereto. In some embodiments, the conductive coil M2 may have an arbitrary spiral pattern such as a circular spiral pattern. The spiral pattern may include multiple spiral turns. An innermost spiral turn may define a first region, which may be referred to as a central area CA, which will be described later. Two adjacent spiral turns may be spaced apart from each other at a predetermined distance. In some embodiments, the distance between the two adjacent spiral turns may be constant in the entire spiral pattern. In some embodiments, a distance between two adjacent spiral turns may be different from a distance between another two adjacent spiral turns.

In some embodiments, the square spiral pattern of the conductive coil M2 may be arranged to surround the central area CA that is an empty space in the center. In the central area CA, the square spiral pattern may not be provided. An area of the first wiring level LV1 corresponding to the central area CA of the second wiring level LV2 may be referred to as a dummy area DA.

In the inductor 100A according to the inventive concept, the plurality of dummy patterns DP may be arranged in the dummy area DA. The central area CA and the plurality of dummy patterns DP may overlap in the vertical direction (the Z direction) and the conductive coil M2 and the plurality of dummy patterns DP may not overlap in the vertical direction (the Z direction).

When viewed in a plan view, a ratio of an area of the plurality of dummy patterns DP to an area of the dummy area DA is about 40% to about 90%. The area occupied by the plurality of dummy patterns DP in the dummy area DA may be such that stress may not be concentrated on one place (e.g., the conductive line M1) and may be dispersed into the plurality of dummy patterns DP. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Each of the plurality of dummy patterns DP may be in the form of an island that floats (i.e., electrically floats) while being surrounded by the lower insulating layer 113, the ILD 115, and the multilayered insulating layer 120 that are insulating materials. In some embodiments, each dummy pattern may be surrounded by at least two different insulating materials. For example, the ILD 115 may be, for example, PSG, BPSG, USG, TEOS, PE-TEOS, HDP-CVD oxide, or oxide such as a low dielectric constant material and an ultralow dielectric constant material used for BEOL; the lower insulating layer 113 may be, for example, phosphor silicate glass (PSG), boro-phosphor silicate glass (BPSG), undoped silicate glass (USG), tetra ethyl ortho silicate (TEOS), plasma enhanced-TEOS (PE-TEOS), high density plasma-chemical vapor deposition (HDP-CVD) oxide, or oxide such as a low dielectric constant material and an ultralow dielectric constant material used for back-end of line (BEOL); and the lower first insulating layer 121 may include or may be formed of silicon carbonitride (SiCN), and the upper second insulating layer 123 may include or may be formed of silicon nitride (SiN). The plurality of dummy patterns DP may have at least two different shapes. However, the inventive concept is not limited thereto. At least some of the plurality of dummy patterns DP may have the same shape as each other. In some embodiments, the plurality of dummy patterns DP may have at least two different sizes in area. The inventive concept, however, is not limited thereto.

In the inductor 100A according to the inventive concept, a length M2X of the conductive coil M2 in the first horizontal direction (the X direction) may be about 45 μm to about 55 μm and a length M2Y of the conductive coil M2 in the second horizontal direction (the Y direction) may be about 65 μm to about 75 μm. For example, the conductive coil M2 may be rectangular. A length CAX of the central area CA in the first horizontal direction (the X direction) may be about 15 μm to about 20 μm and a length CAY of the central area CA in the second horizontal direction (the Y direction) may be about 30 μm to about 40 μm. However, the inductor 100A according to the inventive concept is not limited to the above numerical values. The length of the dummy area DA may be equal to a length of the central area CA.

Recently, as semiconductor package manufacturing technology and wireless communication technology improve, technology of configuring a communication circuit in a semiconductor package is applied. For example, SiP technology of composing semiconductor chips having different characteristics into one package is being developed. When such a package is implemented, an inductor is treated as a very important component. For the communication circuit, a spiral inductor capable of exhibiting high quality is desirable.

Technology of reducing an area of the inductor 100A in the semiconductor substrate 110 by configuring the inductor 100A so as to include the conductive via V1 connecting the conductive line M1 at the first wiring level LV1 to the conductive coil M2 at the second wiring level LV2 in the vertical direction (the Z direction) is used. Stress may be concentrated on the conductive line M1 at the first wiring level LV1, and cracks may be generated in the multilayered insulating layer 120 arranged on the conductive line M1 due to a delamination phenomenon.

In order to solve such a problem, the inductor 100A included in the semiconductor package 10 according to the inventive concept may include the plurality of dummy patterns DP that are arranged around the conductive line M1. Stress concentrated on the conductive line M1 is dispersed into the plurality of dummy patterns DP so that generation of cracks may be efficiently suppressed. Because the plurality of dummy patterns DP may be formed in a process of forming the conductive line M1 without an additional process, the existing process may be used as it is. In some embodiments, the conductive line M1 and the plurality of dummy patterns DP may be formed using a same process.

As a result, the semiconductor package 10 according to the inventive concept has high reliability, and high production efficiency as well as simple and firm manufacturing processes at lower manufacturing costs.

FIGS. 2A to 3B are views illustrating inductors 100B and 100C according to an embodiment of the inventive concept.

Most components configuring the inductors 100B and 100C described hereinafter and materials of which the components are formed are the same as or similar to those described with reference to FIGS. 1A to 1D. Description is given mainly based on a difference between the inductor 100A and the inductors 100B and 100C.

Figure 2A:
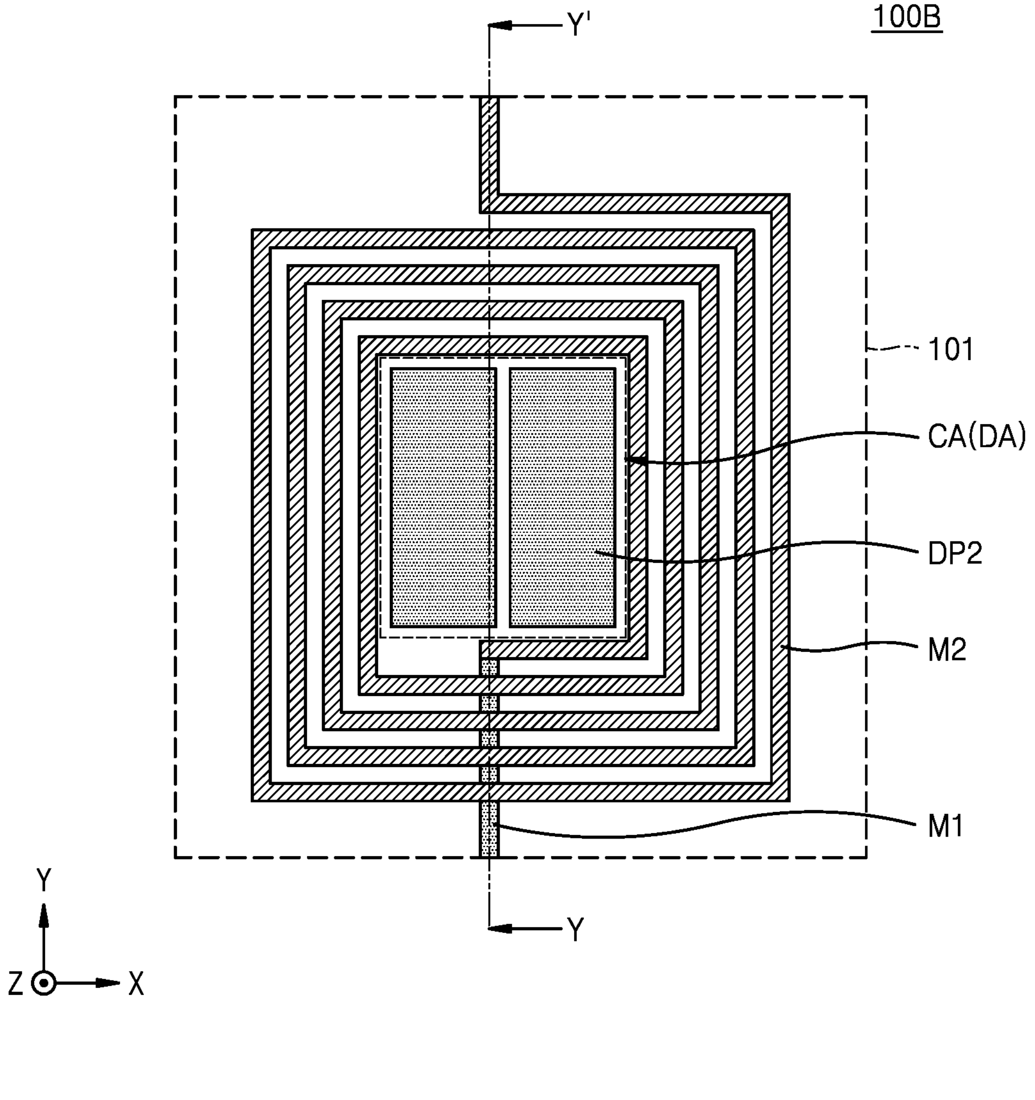
FIGS. 2A and 2B, and FIGS. 3A and 3B are views illustrating inductors according to an embodiment of the inventive concept.
Figure 2B:
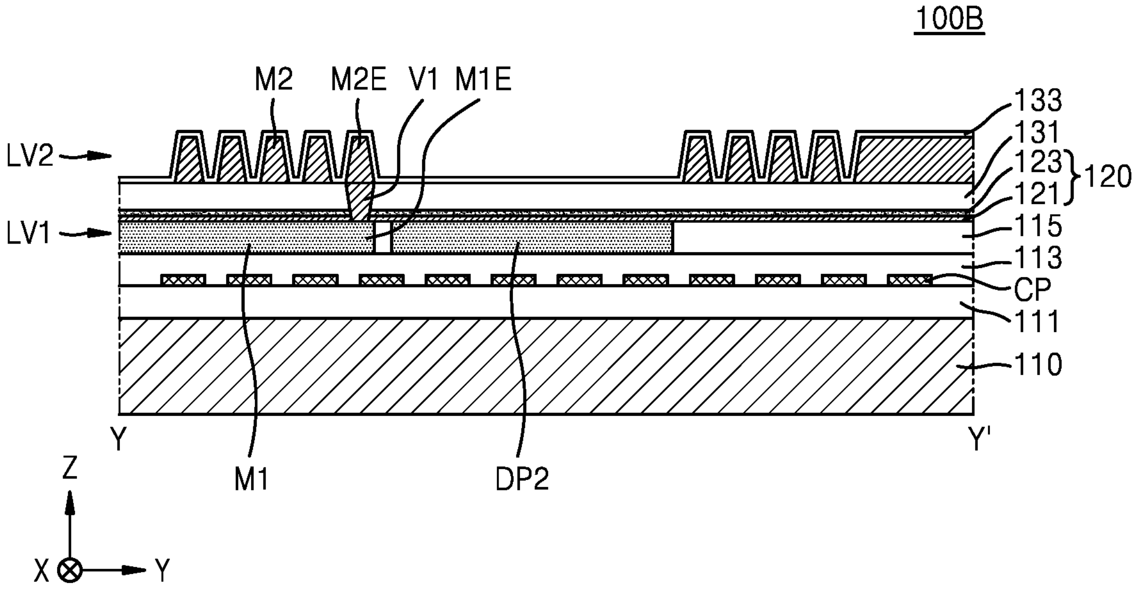

Referring to FIGS. 2A and 2B, the inductor 100B includes a conductive line M1 and two dummy patterns DP2 at a first wiring level LV1, a conductive coil M2 at a second wiring level LV2, and a conductive via V1 connecting the conductive line M1 to the conductive coil M2 in the vertical direction (the Z direction).

In the inductor 100B according to the inventive concept, the two dummy patterns DP2 may be arranged in a dummy area DA. A central area CA and the two dummy patterns DP2 overlap in the vertical direction (the Z direction) and the conductive coil M2 and the two dummy patterns DP2 may not overlap in the vertical direction (the Z direction).

When viewed in a plan view, a ratio of an area of the two dummy patterns DP2 to an area of the dummy area DA may be no less than about 50%. An area of two dummy patterns DP2 occupying in the dummy area DA may be such that in the dummy area DA, stress may not be concentrated on one place and may be dispersed into the two dummy patterns DP2.

Each of the two dummy patterns DP2 may be in the form of an island that floats while being surrounded by a lower insulating layer 113, an ILD 115, and a multilayered insulating layer 120 that are insulating materials. The two dummy patterns DP2 may have the same shape as each other. However, the inventive concept is not limited thereto. In some embodiments, the two dummy patterns DP2 may have different shapes from each other.

Figure 3A:
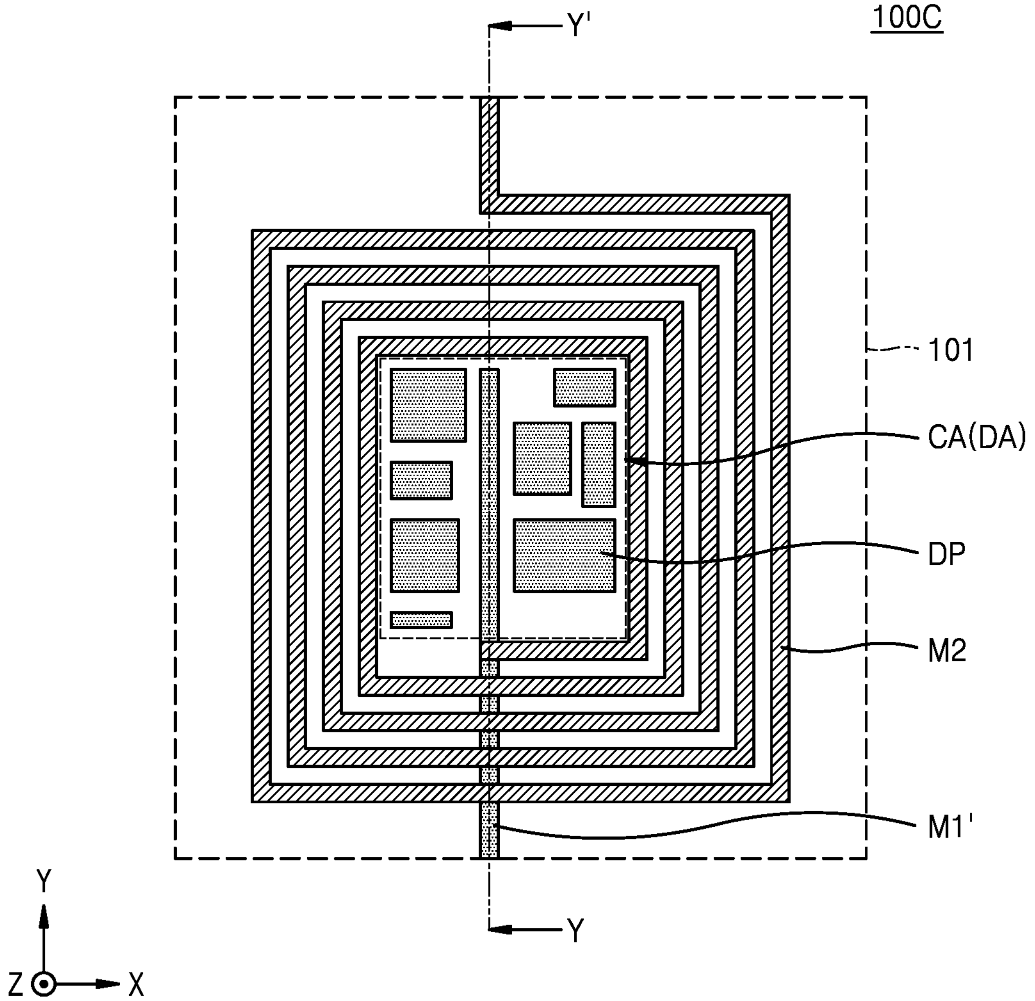
Figure 3B:
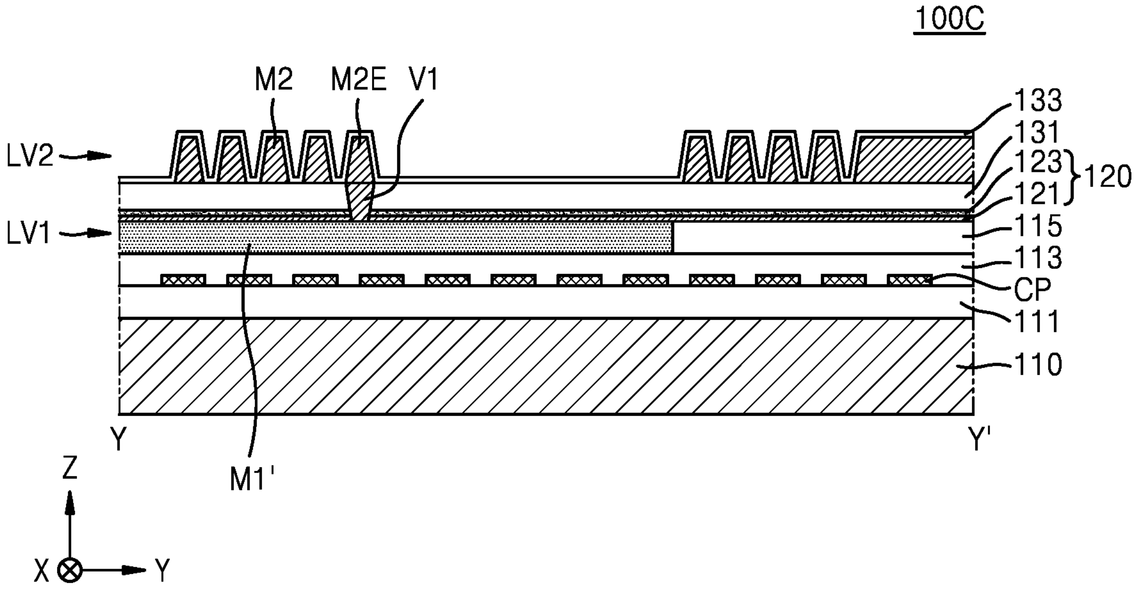

Referring to FIGS. 3A and 3B, the inductor 100C includes an extended conductive line M1' at a first wiring level LV1, a conductive coil M2 at a second wiring level LV2, and a conductive via V1 connecting the extended conductive line M1' to the conductive coil M2 in the vertical direction (the Z direction).

In the inductor 100C according to the inventive concept, the extended conductive line M1' may be straight line shaped and the conductive via V1 may contact a portion that is not an end of the straight line. In some embodiments, the extended conductive line M1' may extend to the dummy area DA in the second horizontal direction (the Y direction).

In some embodiments, a plurality of dummy patterns DP and a part of the extended conductive line M1' may be arranged in the dummy area DA. The central area CA, the plurality of dummy patterns DP, and a part of the extended conductive line M1' may overlap in the vertical direction (the Z direction). The conductive coil M2 and the plurality of dummy patterns DP may not overlap in the vertical direction (the Z direction).

When viewed in a plan view, a ratio of an area of the plurality of dummy patterns DP and a part of the extended conductive line M1' to an area of the dummy area DA may be about 40% to about 90%. The plurality of dummy patterns DP and a part of the extended conductive line M1' may be arranged in a significant part of the dummy area DA. In the dummy area DA, stress may not be concentrated on one place and may be dispersed into the plurality of dummy patterns DP and the extended conductive line M1'.

Figure 4A:
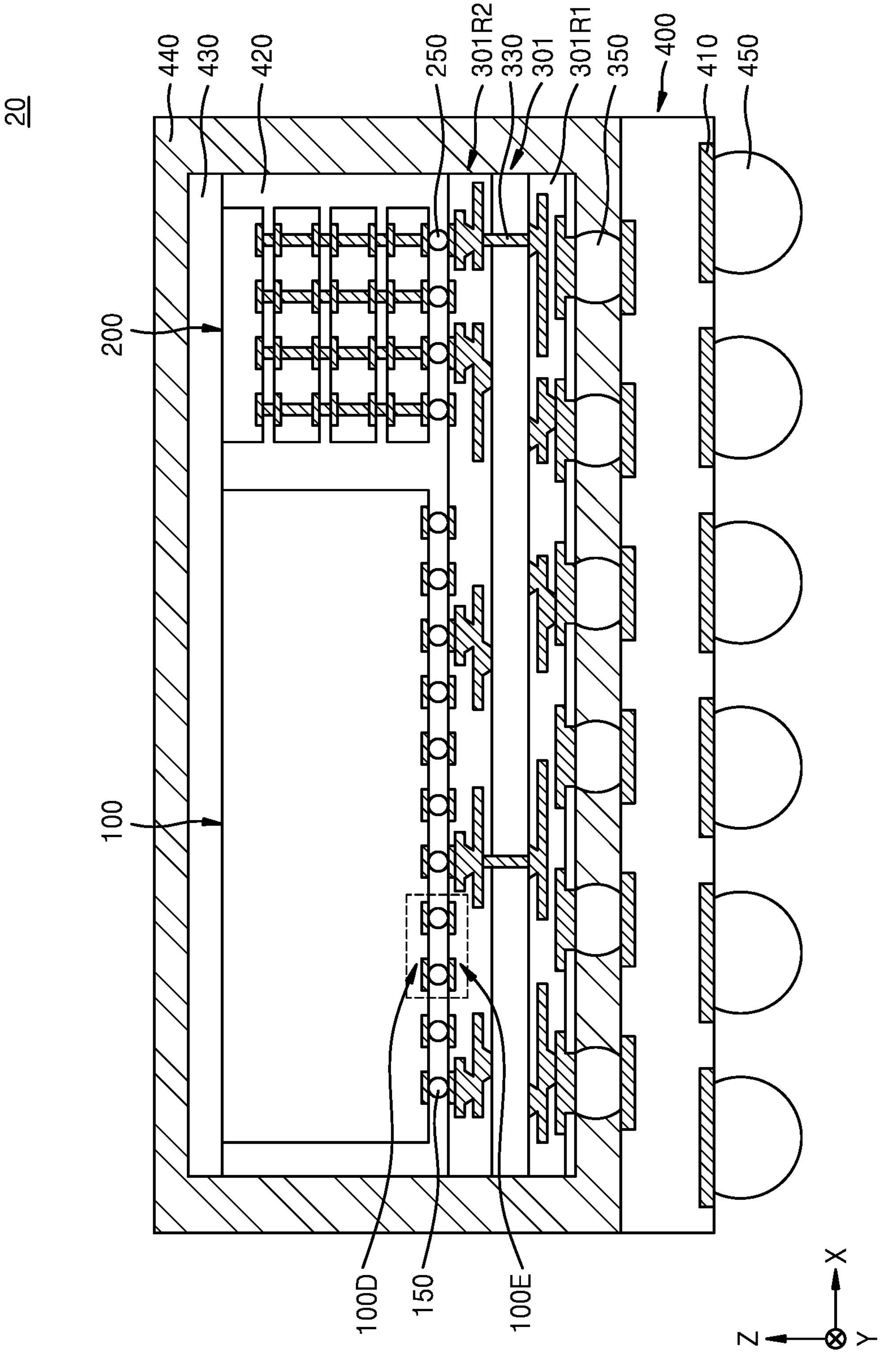
FIG. 4A is a cross-sectional view illustrating a semiconductor package according to an embodiment of the inventive concept.
Figure 4B:
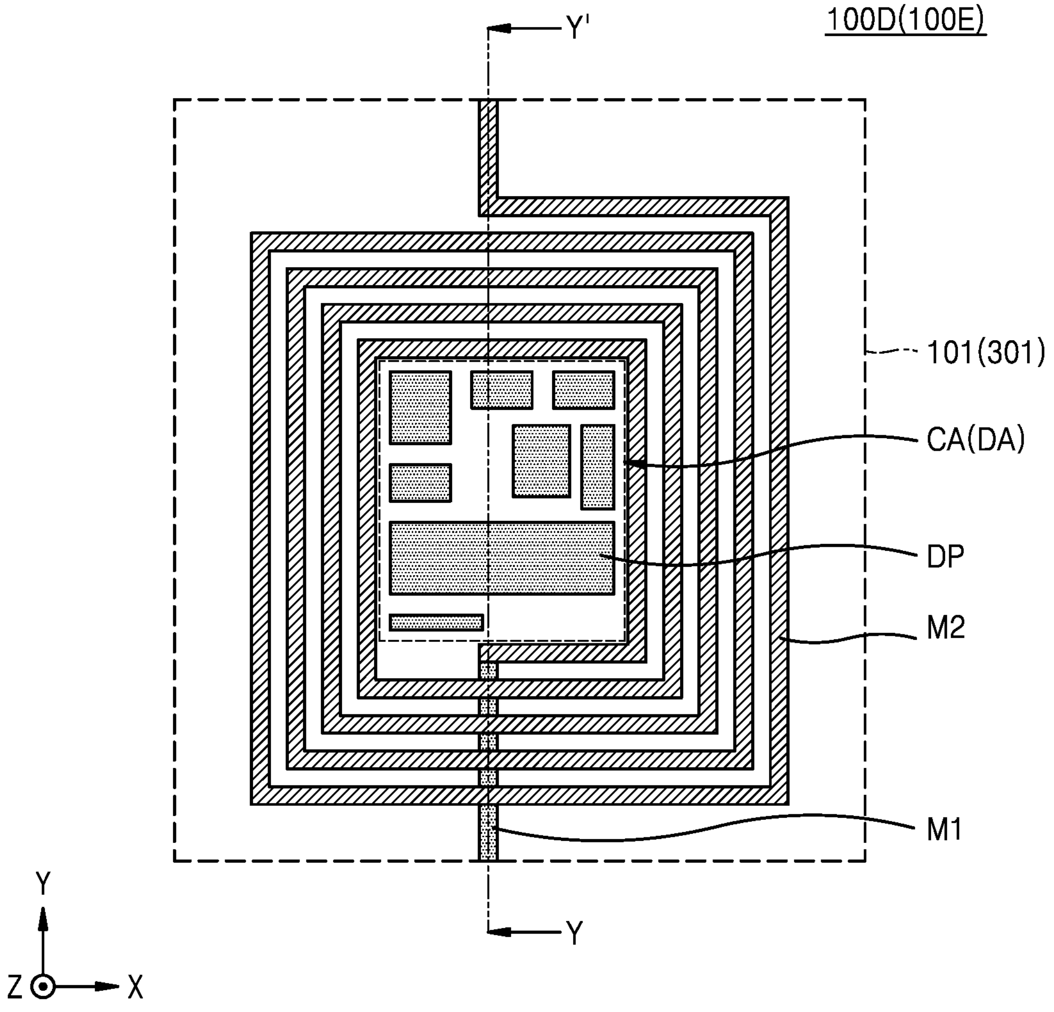
FIG. 4B is a plan view illustrating enlargements of first and second inductors according to an embodiment of the inventive concept in FIG. 4A.

FIG. 4A is a cross-sectional view illustrating a semiconductor package 20 according to an embodiment of the inventive concept. FIG. 4B is a plan view illustrating enlargements of first and second inductors 100D and 100E according to an embodiment of the inventive concept in FIG. 4A.

Figure 4C:
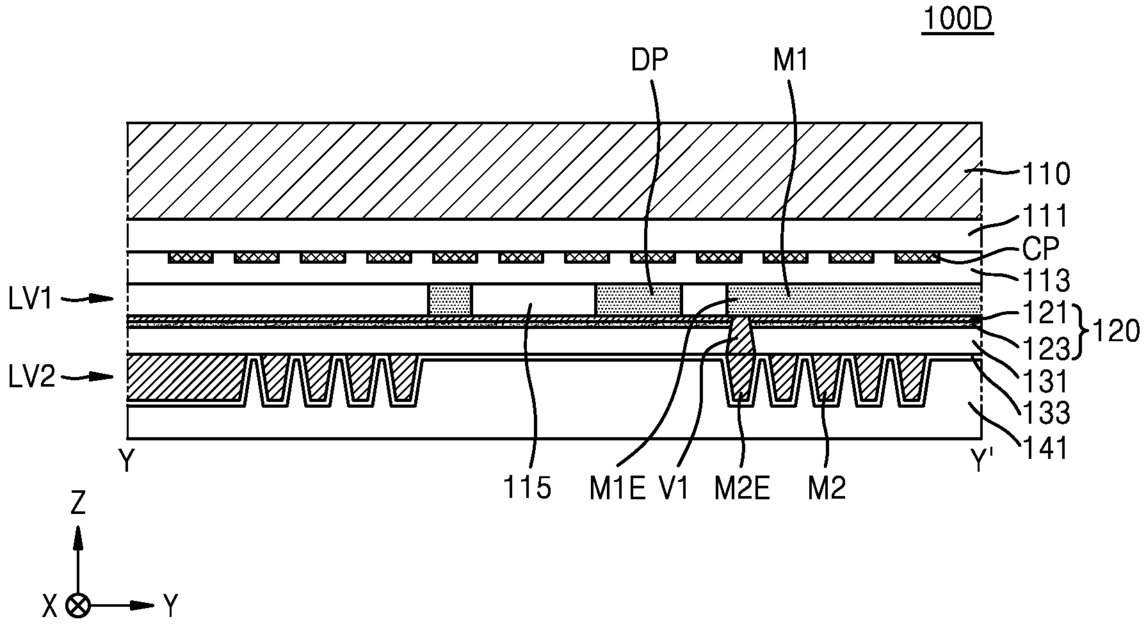
FIG. 4C is a cross-sectional view illustrating the first inductor taken along the line Y-Y' of FIG. 4B.
Figure 4D:
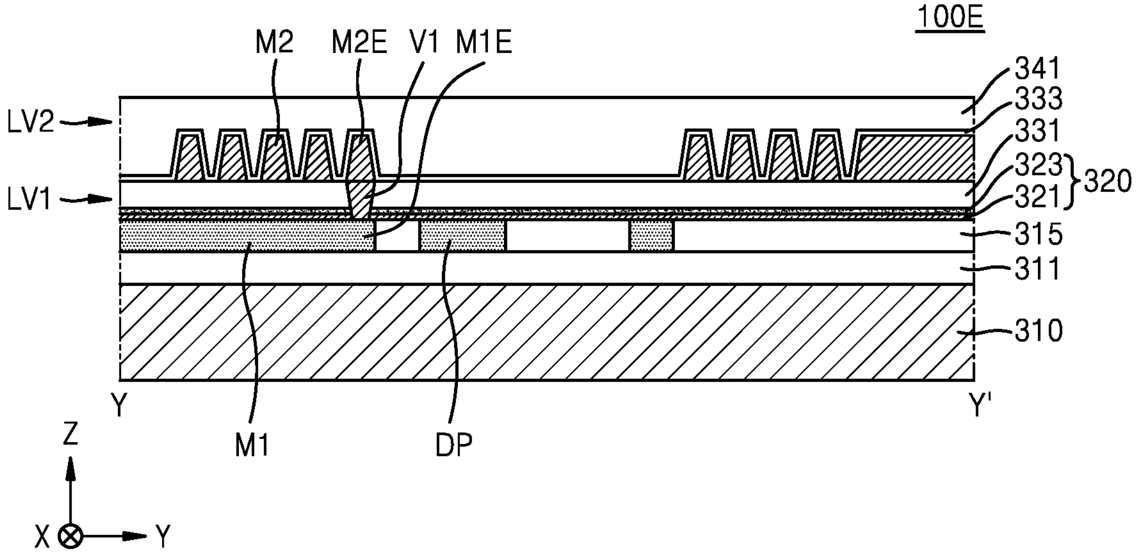
FIG. 4D is a cross-sectional view illustrating the second inductor taken along the line Y-Y' of FIG. 4B.

FIG. 4C is a cross-sectional view illustrating the first inductor 100D taken along the line Y-Y' of FIG. 4B. FIG. 4D is a cross-sectional view illustrating the second inductor 100E taken along the line Y-Y' of FIG. 4B.

In FIG. 4B, the first inductor 100D and the second inductor 100E are illustrated together. In some embodiments, the first inductor 100D and the second inductor 100E may be the same as each other in configuration and size. In FIG. 4C, the first inductor 100D is illustrated as facing an interposer 301. In FIG. 4D, the second inductor 100E is illustrated as facing a first semiconductor chip 100.

Most components configuring the semiconductor package 20 described hereinafter and materials of which the components are formed are the same as or similar to those described with reference to FIGS. 1A to 1D. Description is given mainly based on a difference between the semiconductor package 10 and the semiconductor package 20.

Referring to FIGS. 4A to 4D, the semiconductor package 20 includes the first semiconductor chip 100, a second semiconductor chip 200, the interposer 301, and a package substrate 400.

In the semiconductor package 20 according to the inventive concept, the interposer 301 may be arranged under the first and second semiconductor chips 100 and 200 and may electrically connect the first and second semiconductor chips 100 and 200 with each other. In some embodiments, the interposer 301 may be a Si substrate and may include a first redistribution structure 301R1 arranged under the Si substrate and a second redistribution structure 301R2 arranged on the Si substrate. The interposer 301 may include an internal connection terminal 350 arranged under the first redistribution structure 301R1 and a through electrode 330 connecting the first redistribution structure 301R1 to the second redistribution structure 301R2 through the Si substrate.

In the semiconductor package 20 according to the inventive concept, the first semiconductor chip 100 may include a communication circuit 101 in which a communication device is arranged and the first inductor 100D may be formed in the communication circuit 101. As described above, the interposer 301 may include the second redistribution structure 301R2 thereon and the second inductor 100E may be formed in the second redistribution structure 301R2 or an area adjacent to the second redistribution structure 301R2.

The first inductor 100D includes all the components of the inductor 100A (refer to FIG. 1D) described above. Furthermore, the first inductor 100D may include a protective layer 141 covering a cover insulating layer 133. The protective layer 141 may fill a curved portion of the cover insulating layer 133 and may have a flat surface. The protective layer 141 may include or may be formed of, for example, one of silicon oxide, silicon nitride, silicon oxynitride, and a polymeric material. In some embodiments, the polymeric material may be silicone, epoxy, benzo cyclobutene (BCB), polyimide (PI), or polybenzoxazole (PBO). However, the inventive concept is not limited thereto.

The second inductor 100E includes only some of the components of the inductor 100A (refer to FIG. 1D) described above. A silicon (Si) substrate 310 corresponds to the semiconductor substrate 110 (refer to FIG. 1D), a first insulating material layer 311 corresponds to the IMD layer 111 (refer to FIG. 1D), a second insulating material layer 315 corresponds to the ILD 115 (refer to FIG. 1D), a multilayered insulating layer 320 corresponds to the multilayered insulating layer 120 (refer to FIG. 1D), a third insulating material layer 331 corresponds to the upper insulating layer 131 (refer to FIG. 1D), and a cover insulating layer 333 corresponds to the cover insulating layer 133 (refer to FIG. 1D). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

In the second inductor 100E, the plurality of dummy capacitor patterns CP (refer to FIG. 1D) and the lower insulating layer 113 (refer to FIG. 1D) covering the plurality of dummy capacitor patterns CP may be omitted. The second inductor 100E may include a protective layer 341 covering the cover insulating layer 333. The protective layer 341 may fill a curved portion of the cover insulating layer 333 and may have a flat surface. The protective layer 341 may include or may be formed of, for example, one of silicon oxide, silicon nitride, silicon oxynitride, and a polymeric material. In some embodiments, the polymeric material may be silicone, epoxy, BCB, PI, or PBO. However, the inventive concept is not limited thereto.

In some embodiments, the second inductor 100E may be arranged in the second redistribution structure 301R2. However, the second inductor 100E may be arranged under the second redistribution structure 301R2.

In the semiconductor package 20 according to the inventive concept, because the first inductor 100D may be arranged in the first semiconductor chip 100 and the second inductor 100E may be arranged in the interposer 301, the capacity of the inductor may be remarkably increased in comparison with a case in which the inductor is arranged only in the first semiconductor chip 100.

The semiconductor package 20 according to the inventive concept has high reliability, and high production efficiency as well as simple and firm manufacturing processes at lower manufacturing costs.

Figure 5:
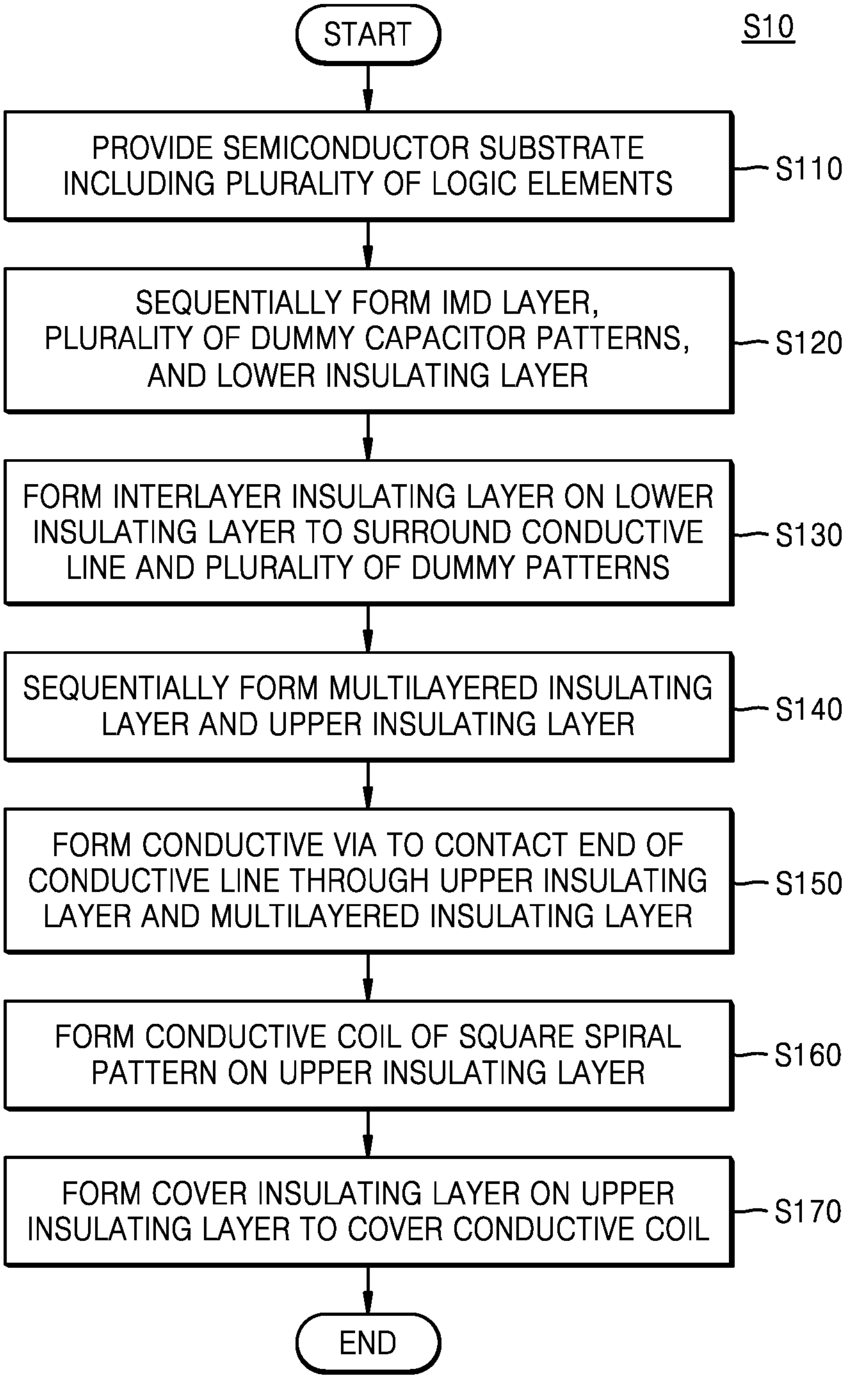
FIG. 5 is a flowchart illustrating a method of manufacturing an inductor according to an embodiment of the inventive concept.

FIG. 5 is a flowchart illustrating a method of manufacturing an inductor according to an embodiment of the inventive concept.

Referring to FIG. 5, an inductor manufacturing method S10 may include first to seventh processes S110 to S170.

When a certain embodiment may be implemented otherwise, a specific process order may be different from what is described. For example, two continuous processes may be simultaneously performed and may be performed in the order reverse to the described order.

The inductor manufacturing method S10 according to the inventive concept includes operation S110 of providing a semiconductor substrate including a plurality of logic elements, operation S120 of sequentially forming an IMD layer, a plurality of dummy capacitor patterns, and a lower insulating layer, operation S130 of forming an interlayer insulating layer on the lower insulating layer to surround a conductive line and a plurality of dummy patterns, operation S140 of sequentially forming a multilayered insulating layer and an upper insulating layer, operation S150 of forming a conductive via to contact an end of the conductive line through the upper insulating layer and the multilayered insulating layer, operation S160 of forming a conductive coil having a square spiral pattern on the upper insulating layer, and operation S170 of forming a cover insulating layer on the upper insulating layer to cover the conductive coil.

Technical features of operations S110 to S170 are described in detail below with reference to FIGS. 6A to 10B.

FIGS. 6A, 7A, 8A, 9A, and 10A are plan views illustrating a method of manufacturing an inductor according to an embodiment of the inventive concept in the order of processes. FIGS. 6B, 7B, 8B, 9B, and 10B are cross-sectional views taken along the line Y-Y' of FIGS. 6A, 7A, 8A, 9A, and 10A.

Figure 6A:
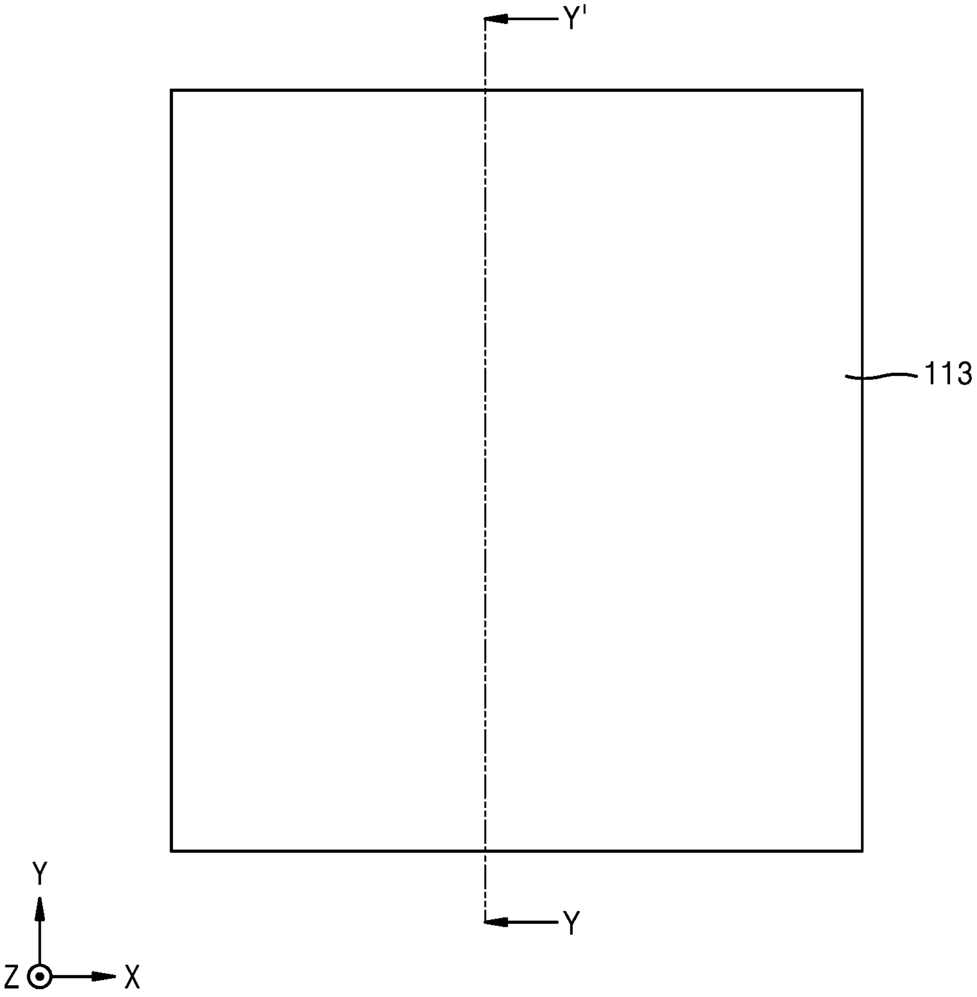
FIGS. 6A, 7A, 8A, 9A, and 10A are plan views illustrating a method of manufacturing an inductor according to an embodiment of the inventive concept in the order of processes.
Figure 6B:
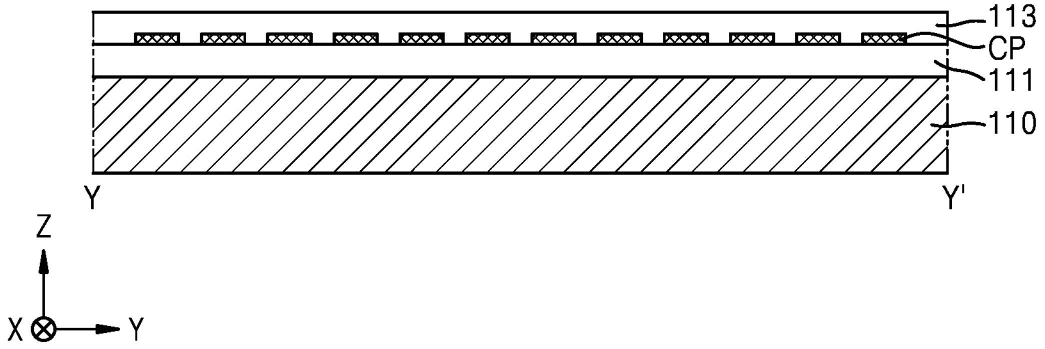
FIGS. 6B, 7B, 8B, 9B, and 10B are cross-sectional views taken along the line Y-Y' of FIGS. 6A, 7A, 8A, 9A, and 10A.

Referring to FIGS. 6A and 6B, the semiconductor substrate 110 including a plurality of logic elements is provided.

The semiconductor substrate 110 as a wafer may include an active surface and an inactive surface facing each other. The plurality of logic elements may be formed on the active surface.

Next, the IMD layer 111 may be formed on the active surface of the semiconductor substrate 110 to cover the plurality of logic elements.

Next, the plurality of dummy capacitor patterns CP may be formed on the IMD layer 111. The plurality of dummy capacitor patterns CP may be formed on the IMD layer 111 in partial areas other than an area in which the MIM capacitor is arranged.

Next, the lower insulating layer 113 may be formed on the IMD layer 111 so as to cover the plurality of dummy capacitor patterns CP.

Figure 7A:
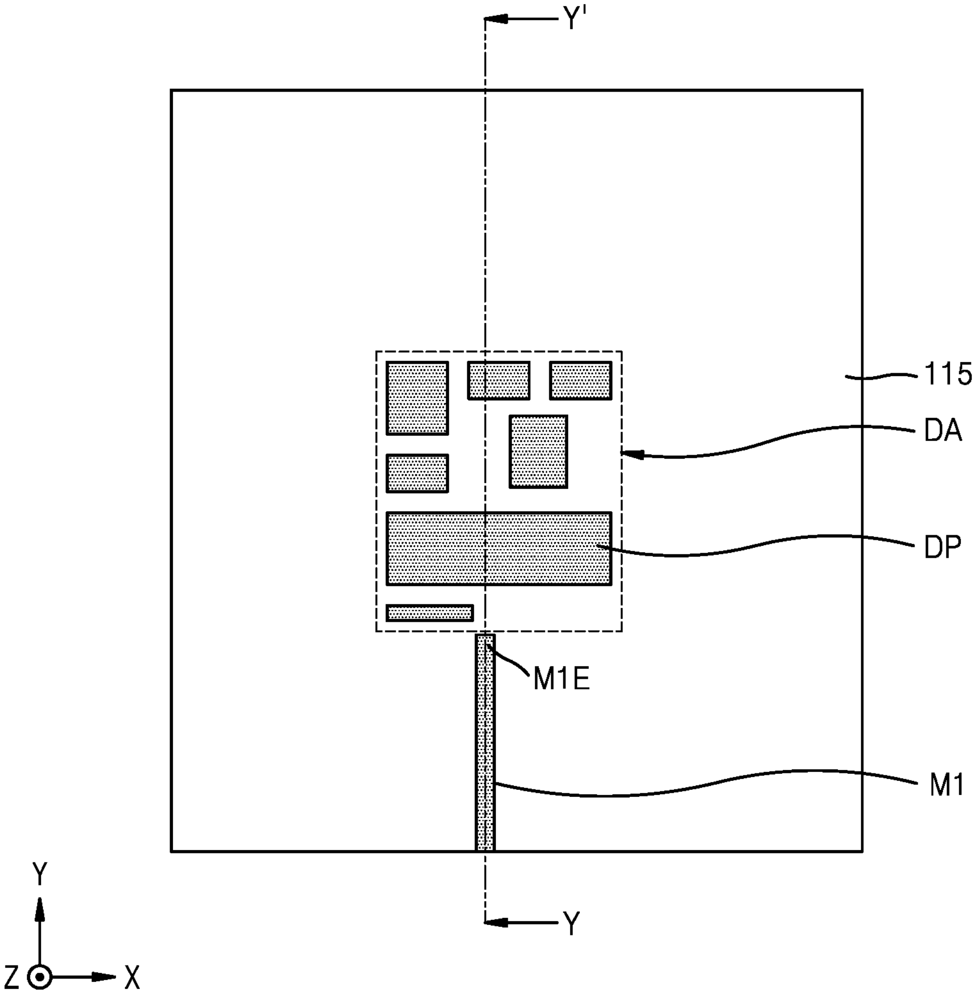
Figure 7B:
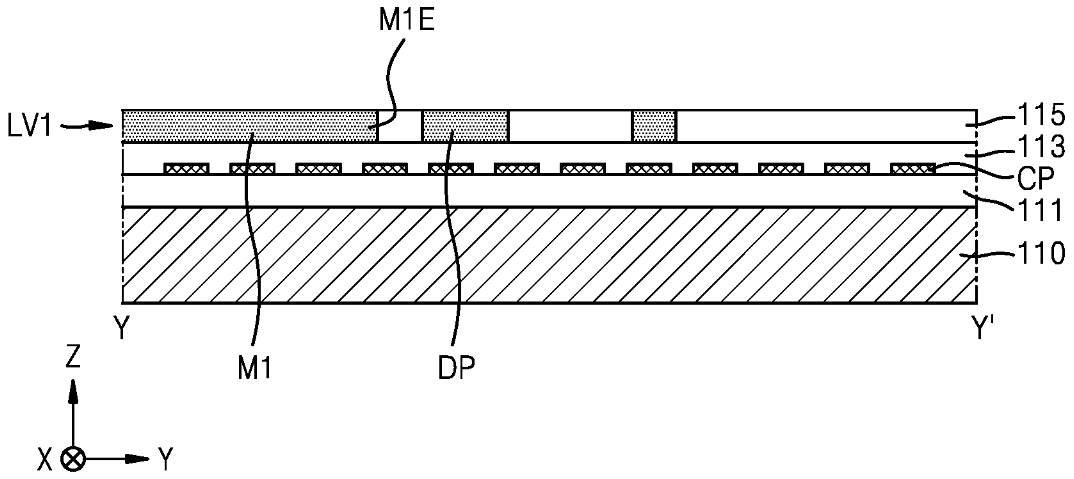

Referring to FIGS. 7A and 7B, the ILD 115 is formed on the lower insulating layer 113 to surround the conductive line M1 and the plurality of dummy patterns DP.

In some embodiments, the ILD 115 may be formed first on the lower insulating layer 113, and the conductive line M1 and the plurality of dummy patterns DP may be formed later by using a damascene process. In other embodiments, the conductive line M1 and the plurality of dummy patterns DP may be formed first on the lower insulating layer 113 and the ILD 115 may be formed later.

When viewed in a plan view, a ratio of an area of the plurality of dummy patterns DP to an area of the dummy area DA is about 40% to about 90%.

Figure 8A:
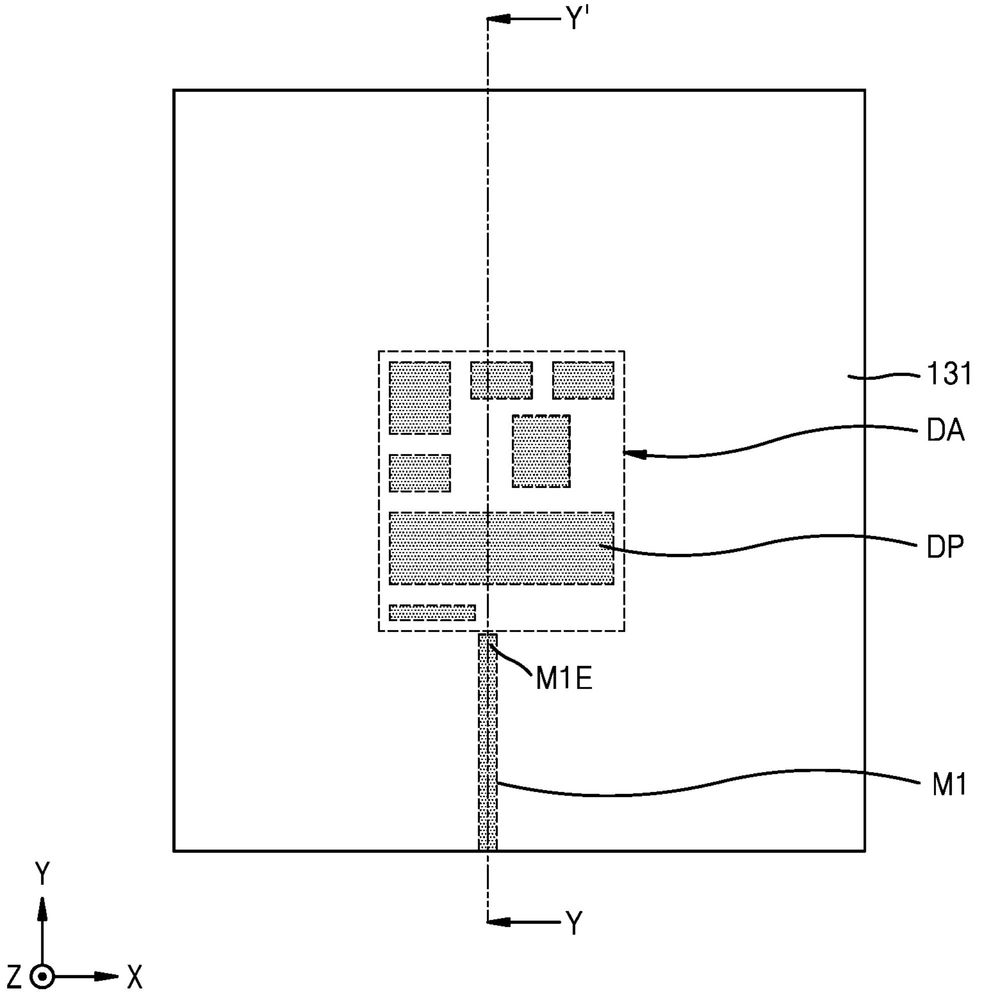
Figure 8B:
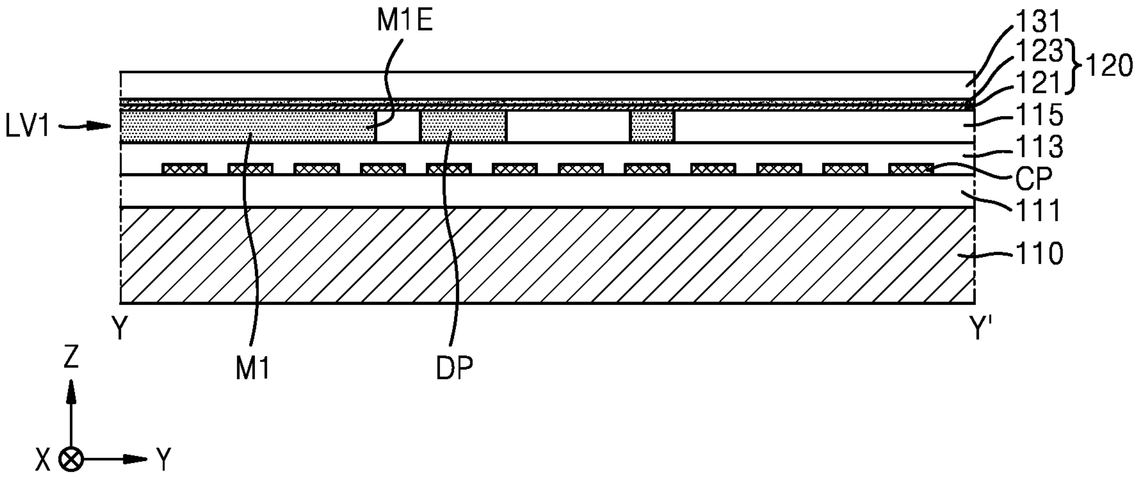

Referring to FIGS. 8A and 8B, the multilayered insulating layer 120 is formed to cover a top surface of the conductive line M1, top surfaces of the plurality of dummy patterns DP, and a top surface of the ILD 115.

The multilayered insulating layer 120 may include the lower first insulating layer 121 and the upper second insulating layer 123. In some embodiments, the lower first insulating layer 121 may include or may be formed of silicon carbonitride (SiCN) and the upper second insulating layer 123 may include or may be formed of silicon nitride (SiN).

Next, the upper insulating layer 131 may be formed to cover the multilayered insulating layer 120.

Figure 9A:
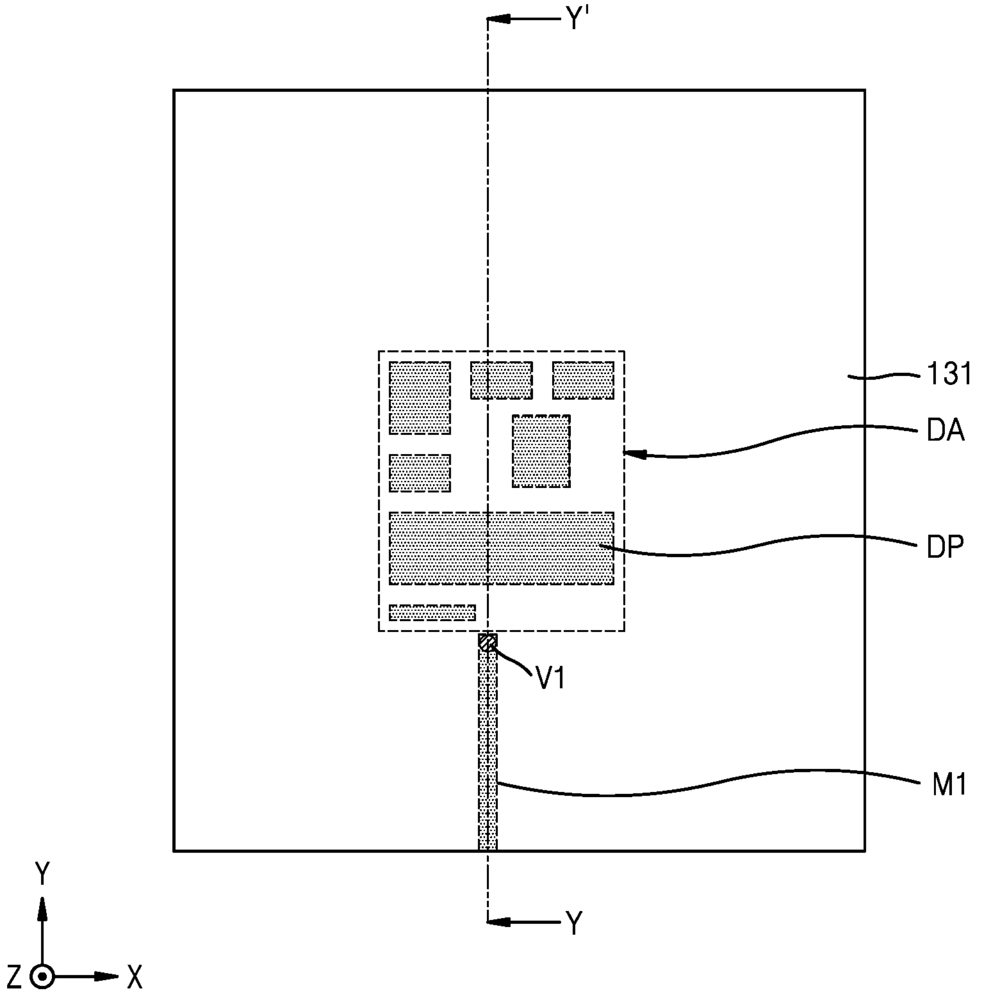
Figure 9B:
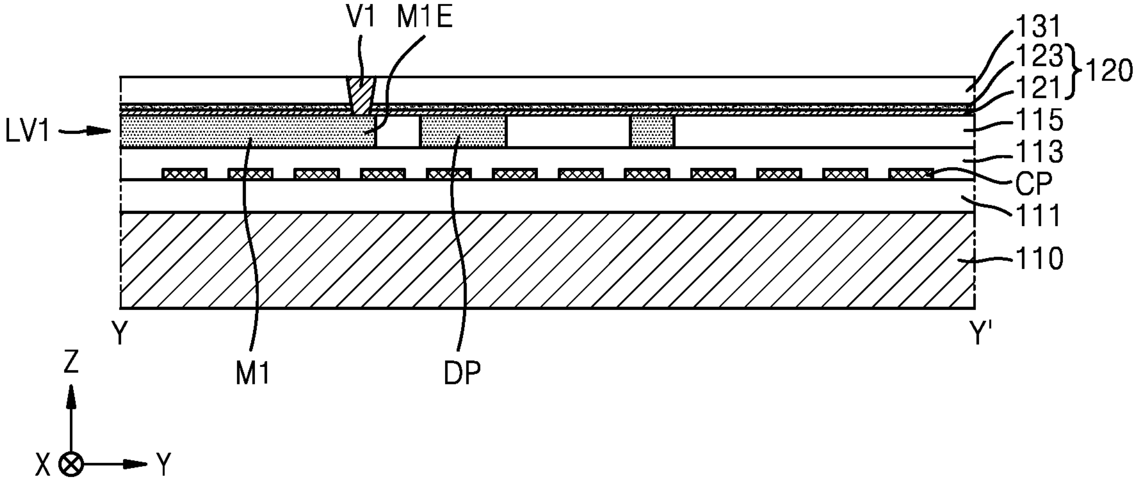

Referring to FIGS. 9A and 9B, the conductive via V1 is formed to contact the first end M1E of the conductive line M1 through the upper insulating layer 131 and the multilayered insulating layer 120.

An opening in which the conductive via V1 is to be formed is formed in the upper insulating layer 131 and the multilayered insulating layer 120 by a photolithography process and an etching process. Due to a characteristic of dry etching, the opening may not have a vertical side wall and may be tapered inverted trapezoid-shaped so that a width thereof is reduced downward in the vertical direction (the Z direction).

Next, the conductive via V1 contacting the first end M1E of the conductive line M1 is formed by filling the opening. In FIGS. 9A and 9B, the conductive via V1 is illustrated as being singular. However, the conductive via V1 may be provided in plural.

Figure 10A:
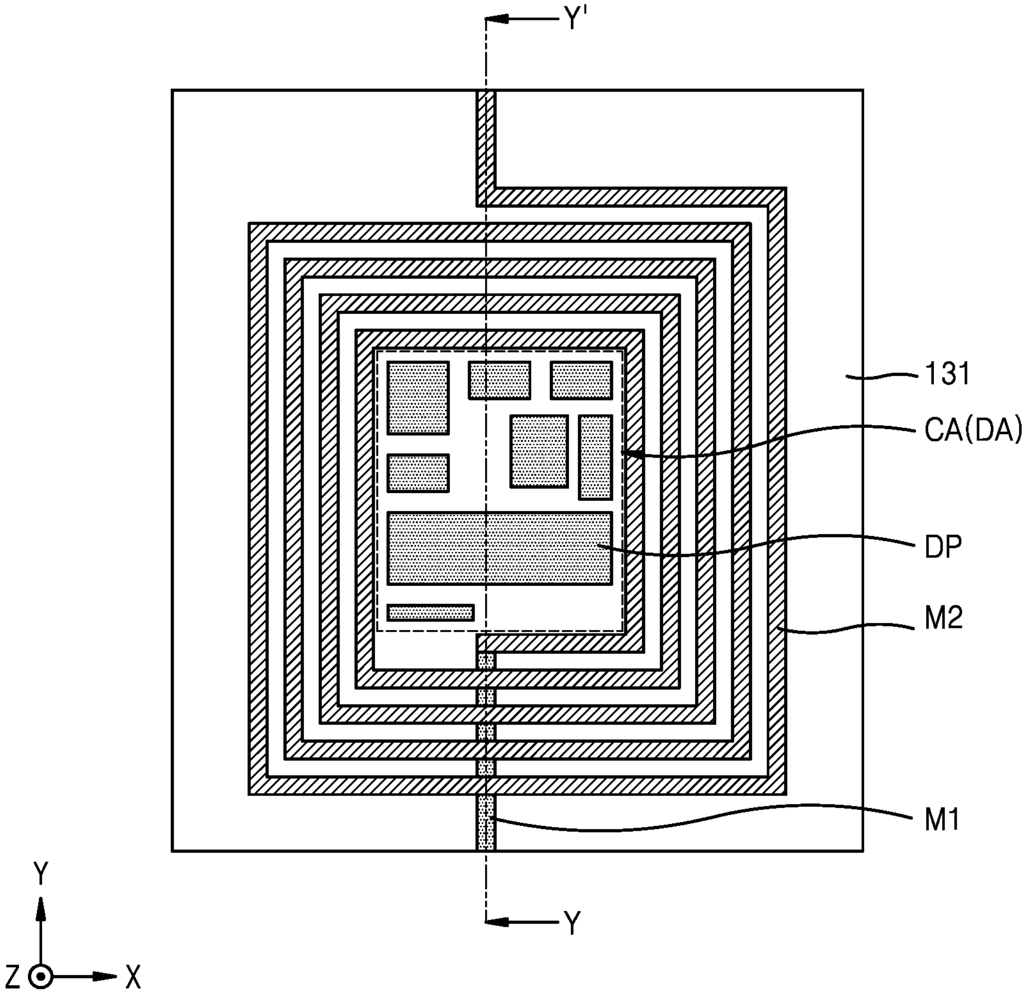
Figure 10B:
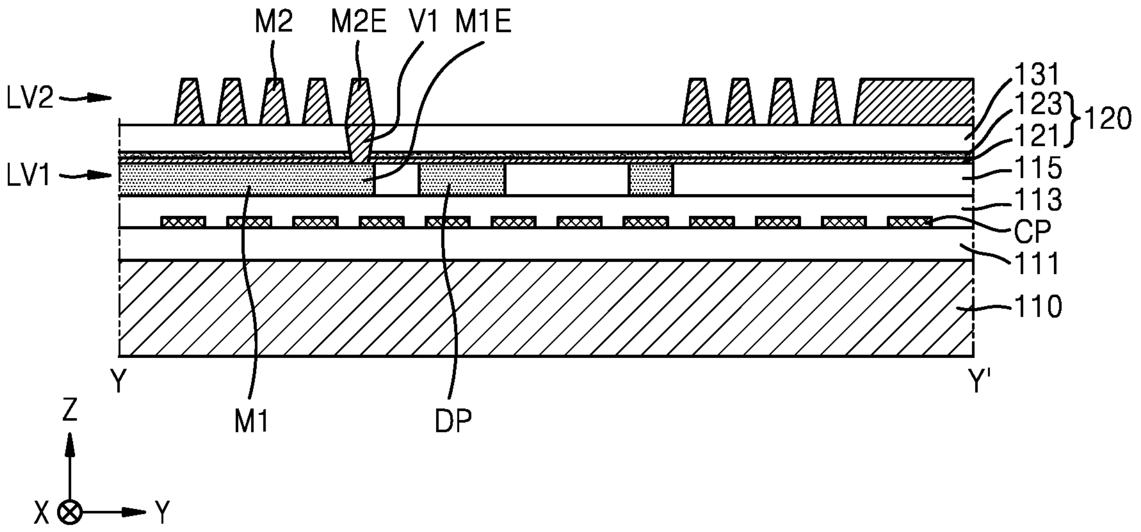

Referring to FIGS. 10A and 10B, the conductive coil M2 is formed on the upper insulating layer 131.

The conductive coil M2 may have a square spiral pattern while the second end M2E of the conductive coil M2 contacting the conductive via V1. A metal wiring line is formed and then is dry etched to be patterned into the conductive coil M2. Due to a characteristic of dry etching, the conductive coil M2 may not have a vertical side wall and may be tapered trapezoid-shaped so that a width thereof increases downward in the vertical direction (the Z direction).

Referring to FIGS. 1C and 1D, the cover insulating layer 133 may be formed on the upper insulating layer 131 to cover the conductive coil M2. The cover insulating layer 133 may be conformally arranged along the curved top surface of the conductive coil M2.

By the method described above, the inductor 100A according to the inventive concept may be manufactured. The semiconductor package 10 according to the inventive concept including the inductor 100A manufactured as described above has high reliability, and high production efficiency as well as simple and firm manufacturing processes at lower manufacturing costs.

Figure 11:
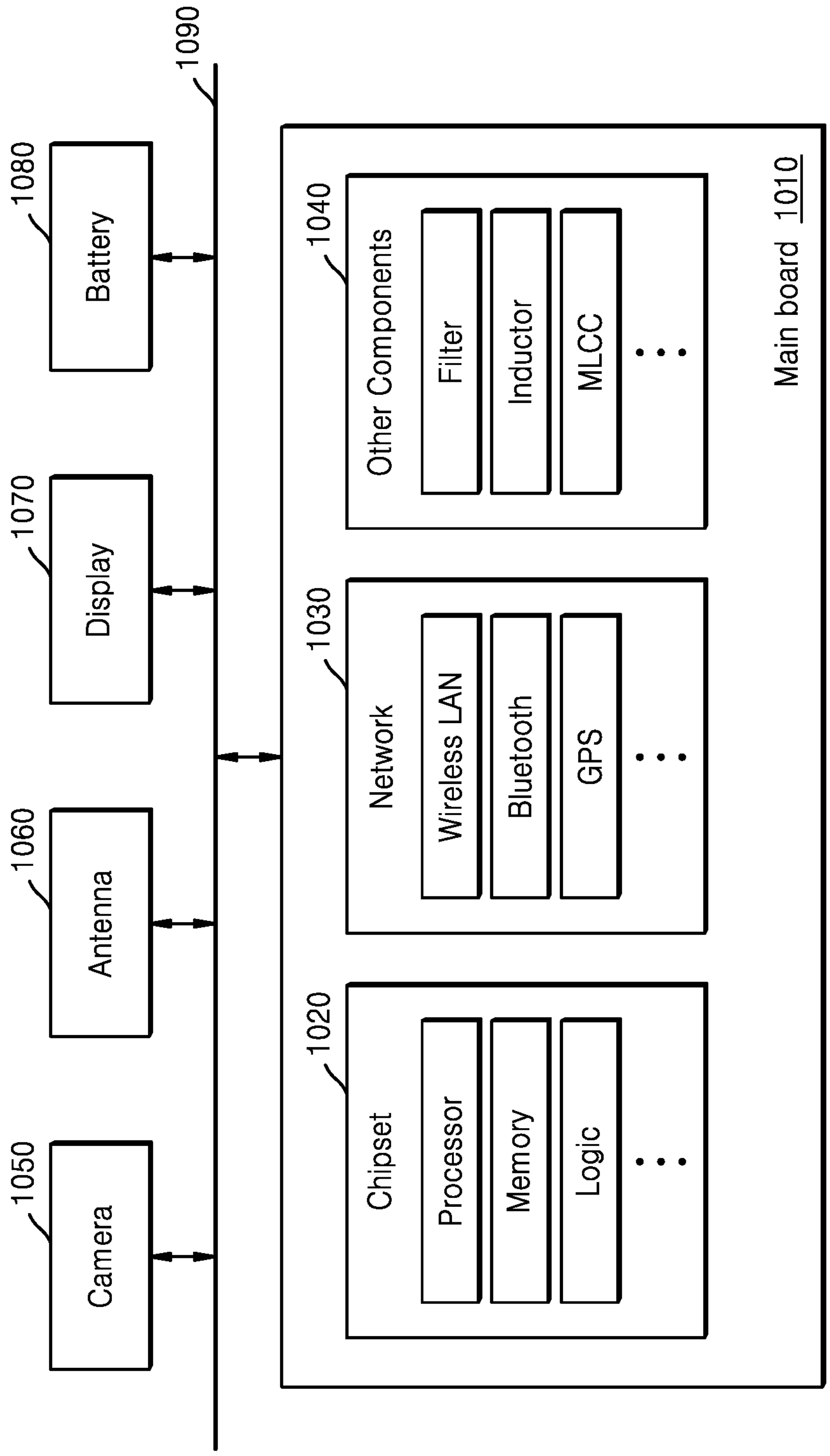
FIG. 11 is a block diagram illustrating an electronic device including a semiconductor package according to an embodiment of the inventive concept.

FIG. 11 is a block diagram illustrating an electronic device 1000 including a semiconductor package according to an embodiment of the inventive concept.

Referring to FIG. 11, the electronic device 1000 accommodates a main board 1010. Chip-related components 1020, network-related components 1030, and other components 1040 may be physically and/or electrically connected to the main board 1010. They are combined with other electronic component to be described below and form various signal lines 1090.

The chip-related components 1020 may include a memory chip such as volatile memory, non-volatile memory, and flash memory, an application processor chip such as a central processor, a graphics processor, a digital signal processor, a cryptographic processor, a microprocessor, and a microcontroller, and a logic chip such as an analog-to-digital converter (ADC) and an application-specific integrated chip (ASIC). Other chip-related electronic components may be included in the chip-related components 1020. The chip-related components 1020 may be combined with one another.

The network-related components 1030 may include WiFi (IEEE 802.11 family), WiMAX (IEEE 802.16 family), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and other arbitrary wired and wireless protocols designated as being after the above protocols. A plurality of other wired and wireless standards or protocols may be included in the network-related components 1030. The network-related components 1030 may be combined with the chip-related components 1020.

The other components 1040 may include a high frequency inductor, a ferrite inductor, a power inductor, ferrite beads, low temperature co-firing ceramics (LTCC), an electromagnetic interference (EMI) filter, or a multilayer ceramic condenser (MLCC). Other passive components used for various purposes may be included in the other components 1040. The other components 1040 may be combined with the chip-related components 1020 and/or the network-related components 1030.

In accordance with a kind of the electronic device 1000, the electronic device 1000 may include other electronic components that may be physically and/or electrically connected to the main board 1010 or not. The other electronic components may include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (not shown), a compact disk (CD) (not shown), and a digital versatile disk (DVD) (not shown). In accordance with a kind of the electronic device 1000, other electronic components used for various purposes may be included.

The electronic device 1000 may include a smartphone, a personal digital assistant, a digital video camera, a digital still camera, a network system, a computer, a monitor, a tablet, a laptop, a netbook, a television, a video game, a smart watch, or an automotive vehicle. The electronic device 1000 may be an arbitrary electronic device processing data.

The semiconductor packages 10 and 20 according to an embodiment of the inventive concept, which are described above with reference to FIGS. 1A to 4D, are applied to the electronic device 1000 for various purposes. In some embodiments, the electronic device 1000 may include one of the inductors 100A, 100B, 100C, 100D, and 100E according to an embodiment of the inventive concept, which are described with reference to FIGS. 1A to 4D.

Figure 12:
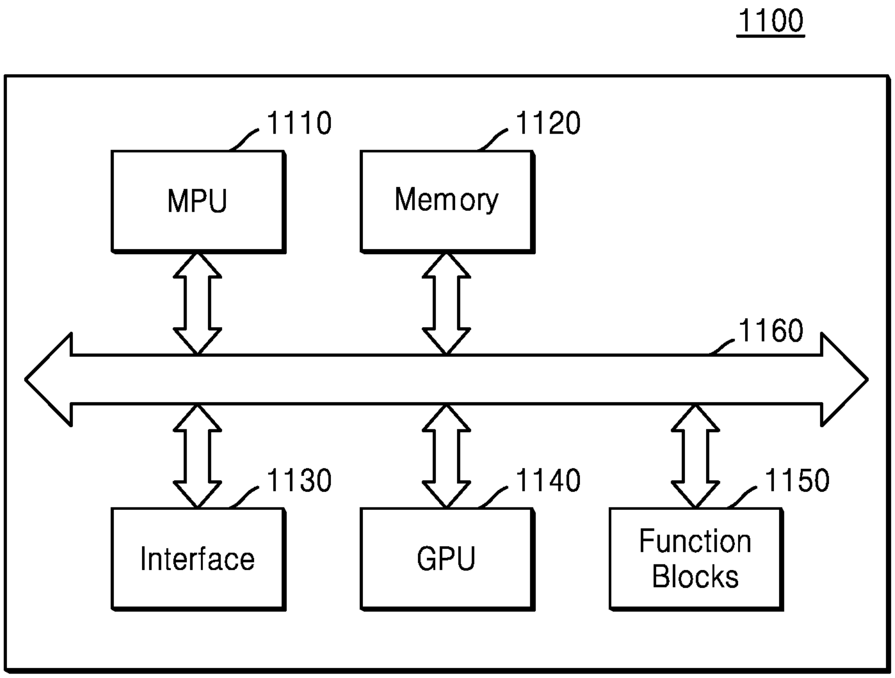
FIG. 12 is a block diagram illustrating a configuration of a semiconductor package according to an embodiment of the inventive concept.

FIG. 12 is a block diagram illustrating a configuration of a semiconductor package 1100 according to an embodiment of the inventive concept.

Referring to FIG. 12, the semiconductor package 1100 may include a micro-processing unit (MPU) 1110, memory 1120, an interface 1130, a graphics processing unit (GPU) 1140, function blocks 1150, and a bus 1160 connecting the above components to one another.

The semiconductor package 1100 may include both the MPU 1110 and the GPU 1140 or one of the MPU 1110 and the GPU 1140.

The MPU 1110 may include a core and a cache. For example, the MPU 1110 may include a multi-core. Cores in the multi-core may have the same performance or different performances. Cores in the multi-core may be simultaneously activated or may be activated at different points in time.

The memory 1120 may store a result processed by the function blocks 1150 by control of the MPU 1110. The interface 1130 may transmit and receive information or signals to and from external devices. The GPU 1140 may perform graphic functions. For example, the GPU 1140 may perform the video codec or three-dimensional (3D) graphics. The function blocks 1150 may perform various functions. For example, when the semiconductor package 1100 is an application processor used for a mobile device, some of the function blocks 1150 may perform a communication function.

The semiconductor package 1100 may include one of the semiconductor packages 10 and 20 according to an embodiment of the inventive concept, which are described above with reference to FIGS. 1A to 4D.

While the inventive concept has been particularly shown and described with reference to embodiments thereof, it will be understood that various changes in form and details may be made therein without departing from the spirit and scope of the following claims.

What is claimed:

1. A semiconductor package comprising:

a package substrate;

an interposer arranged on the package substrate;

a first semiconductor chip and a second semiconductor chip arranged on the interposer;

a first inductor formed in the first semiconductor chip; and a second inductor formed in the interposer, wherein each of the first inductor and the second inductor comprises:

a straight conductive line, at a first wiring level, having a first end;

a conductive coil of a spiral pattern, at a second wiring level vertically spaced apart from the first wiring level, having a second end; and a conductive via vertically connecting the first end of the straight conductive line to the second end of the conductive coil, wherein, when viewed in a plan view, a plurality of island-shaped dummy patterns are arranged in a first area defined by an innermost turn of the spiral pattern, wherein the plurality of island-shaped dummy patterns are disposed at the first wiring level, and wherein each of the plurality of island-shaped dummy patterns electrically floats while being surrounded by insulating materials.

2. The semiconductor package of claim 1, wherein the interposer comprises:

a silicon (Si) substrate;

a through electrode passing through the Si substrate; and a redistribution structure electrically connected to the through electrode on the Si substrate, and wherein the second inductor is formed in the redistribution structure.

3. The semiconductor package of claim 1, wherein the first semiconductor chip includes a logic chip including a PCI Express interface, and wherein the second semiconductor chip includes a high bandwidth memory (HBM) chip.

4. The semiconductor package of claim 1, wherein, when each of the first inductor and the second inductor is viewed from a plan view, the conductive coil does not overlap the plurality of island-shaped dummy patterns.

5. The semiconductor package of claim 1, wherein, in each of the first inductor and the second inductor, a ratio of an area of the plurality of island-shaped dummy patterns to the first area has a value between about 40% and about 90%.

6. The semiconductor package of claim 1, wherein the spiral pattern is a rectangular spiral pattern.

7. A semiconductor package comprising:

a package substrate;

an interposer arranged on the package substrate;

a first semiconductor chip and a second semiconductor chip arranged on the interposer, wherein the first semiconductor chip is adjacent to the second semiconductor chip in a horizontal direction parallel to an upper surface of the interposer;

an inductor formed in the first semiconductor chip;

a molding member surrounding the first semiconductor chip and the second semiconductor chip;

a heat dissipation member arranged on the molding member; and an encapsulation surrounding the interposer, the molding member, and the heat dissipation member, wherein the inductor comprises:

a straight conductive line, at a first wiring level, having a first end;

a conductive coil of a square spiral pattern, at a second wiring level vertically spaced apart from the first wiring level, having a second end; and a conductive via vertically connecting the first end of the straight conductive line to the second end of the conductive coil, wherein, when viewed in a plan view, a plurality of dummy patterns having different shapes are arranged in a first area defined by an innermost turn of the square spiral pattern, wherein the plurality of dummy patterns are disposed at the first wiring level, and wherein each of the plurality of dummy patterns electrically floats while being surrounded by insulating materials.

8. The semiconductor package of claim 7, wherein, when the inductor is viewed in a plan view, the conductive coil does not overlap the plurality of dummy patterns, and wherein a ratio of an area of the plurality of dummy patterns to an area of the first area has a value between about 40% and about 90%.

9. The semiconductor package of claim 7, wherein a length of the conductive coil in the horizontal direction has a value between about 45 μm and about 55 μm, and a length of the conductive coil in a vertical direction has a value between about 65 μm and about 75 μm, and wherein a length of the first area in a first horizontal direction has a value between about 15 μm and about 20 μm, and a length of the first area in a second horizontal direction perpendicular to the first horizontal direction has a value between about 30 μm and about 40 μm.

10. The semiconductor package of claim 7, wherein the plurality of dummy patterns are arranged such that stress concentrated on the straight conductive line is dispersed among the plurality of dummy patterns.

11. The semiconductor package of claim 7, wherein the first semiconductor chip includes a logic chip including a PCI Express interface, and wherein the second semiconductor chip includes a high bandwidth memory (HBM) chip.

* * * * *